(12) United States Patent  
Duval et al.

(10) Patent No.: US 11,922,054 B2  
(45) Date of Patent: Mar. 5, 2024

(54) TECHNIQUES FOR TEMPERATURE-BASED ACCESS OPERATIONS

(71) Applicant: Micron Technology, Inc., Boise, ID (US)

(72) Inventors: Olivier Duval, San Jose, CA (US); Christopher Joseph Bueb, Folsom, CA (US)

(73) Assignee: Micron Technology, Inc., Boise, ID (US)

( * ) Notice: Subject to any disclaimer, the term of this patent is extended or adjusted under 35 U.S.C. 154(b) by 113 days.

(21) Appl. No.: 17/711,439

(22) Filed: Apr. 1, 2022

(65) Prior Publication Data

US 2023/0315332 A1 Oct. 5, 2023

(51) Int. Cl.  
*G06F 3/06* (2006.01)

(52) U.S. Cl.  
CPC .......... *G06F 3/0655* (2013.01); *G06F 3/0604* (2013.01); *G06F 3/0679* (2013.01)

(58) Field of Classification Search  
None  
See application file for complete search history.

(56) References Cited

U.S. PATENT DOCUMENTS

| | | | |
|---|---|---|---|
| 2016/0117216 A1* | 4/2016 | Muchherla | G06F 11/30 714/6.11 |
| 2020/0043555 A1* | 2/2020 | Luo | G11C 16/10 |
| 2021/0149564 A1* | 5/2021 | Luo | G06F 3/0616 |

* cited by examiner

*Primary Examiner* — Brian R Peugh  
(74) *Attorney, Agent, or Firm* — Holland & Hart LLP

(57) ABSTRACT

Methods, systems, and devices for techniques for temperature-based access operations are described. A memory system may be configured to write temperature information to metadata during a write operation. The temperature information may indicate a temperature range within which the memory system may be during the write operation. The memory system may perform a corresponding read operation based on the temperature information written to the metadata and a temperature of the memory system during the read operation. A server may determine and indicate parameters associated with writing the temperature information to the metadata. Additionally, or alternatively, the server may indicate trim parameters for use in performing read operations based on temperature information received from the memory system. In some examples, the memory system may perform targeted refresh operations at locations based on temperature information stored associated with the locations.

32 Claims, 14 Drawing Sheets

TECHNIQUES FOR TEMPERATURE-BASED ACCESS OPERATIONS

FIELD OF TECHNOLOGY

The following relates to one or more systems for memory, including techniques for temperature-based access operations.

BACKGROUND

Memory devices are widely used to store information in various electronic devices such as computers, user devices, wireless communication devices, cameras, digital displays, and the like. Information is stored by programming memory cells within a memory device to various states. For example, binary memory cells may be programmed to one of two supported states, often corresponding to a logic 1 or a logic 0. In some examples, a single memory cell may support more than two possible states, any one of which may be stored by the memory cell. To access information stored by a memory device, a component may read (e.g., sense, detect, retrieve, identify, determine, evaluate) the state of one or more memory cells within the memory device. To store information, a component may write (e.g., program, set, assign) one or more memory cells within the memory device to corresponding states.

Various types of memory devices exist, including magnetic hard disks, random access memory (RAM), read-only memory (ROM), dynamic RAM (DRAM), synchronous dynamic RAM (SDRAM), static RAM (SRAM), ferroelectric RAM (FeRAM), magnetic RAM (MRAM), resistive RAM (RRAM), flash memory, phase change memory (PCM), 3-dimensional cross-point memory (3D cross point), not-or (NOR) and not-and (NAND) memory devices, and others. Memory devices may be described in terms of volatile configurations or non-volatile configurations. Volatile memory cells (e.g., DRAM) may lose their programmed states over time unless they are periodically refreshed by an external power source. Non-volatile memory cells (e.g., NAND) may maintain their programmed states for extended periods of time even in the absence of an external power source.

DETAILED DESCRIPTION

Figure 1:
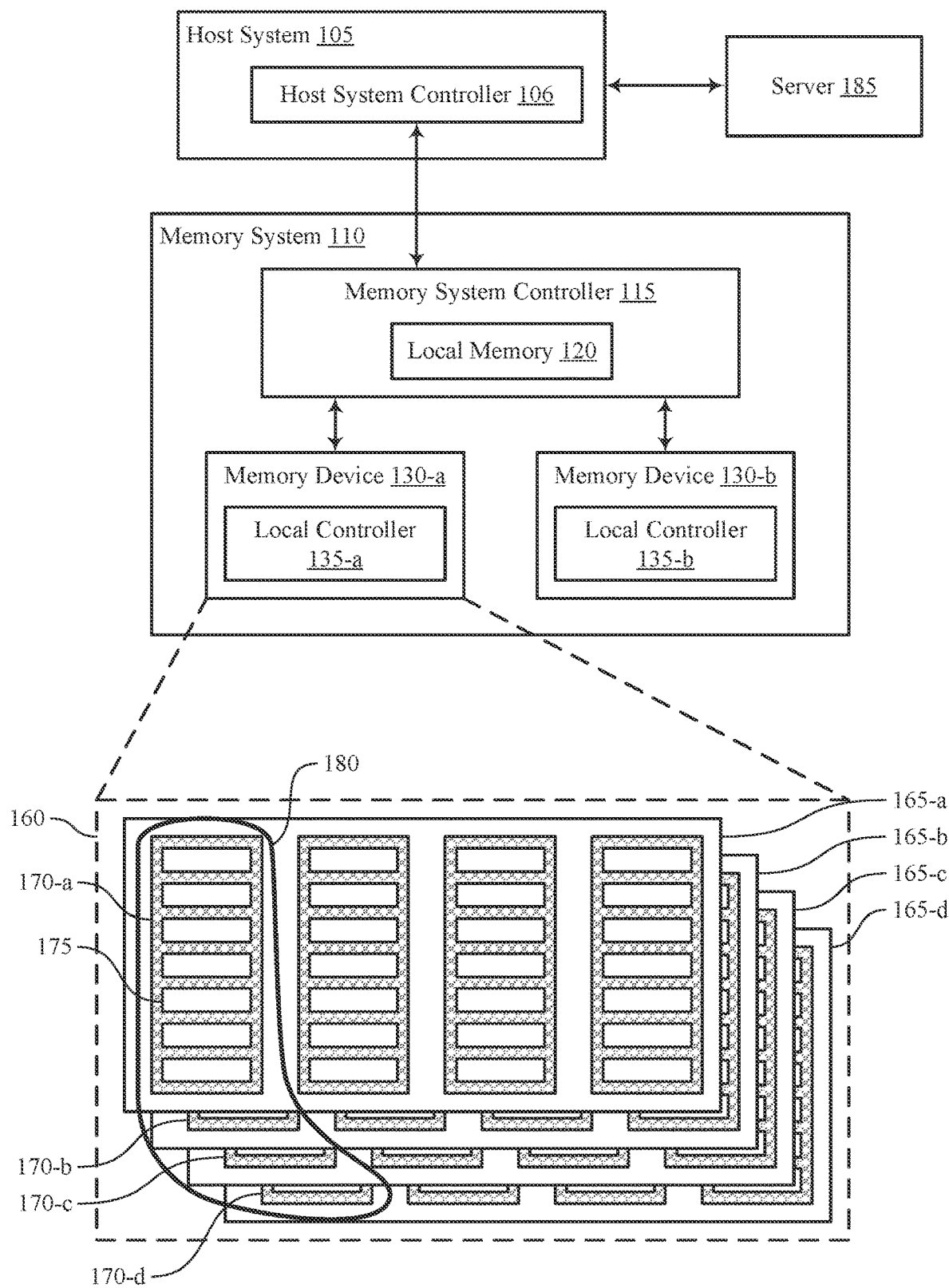
FIG. 1 illustrates an example of a system that supports techniques for temperature-based access operations in accordance with examples as disclosed herein.

Some memory systems, such as non-volatile memory systems (e.g., memory systems that include non-volatile memory cells, such as NAND memory cells or Flash memory cells), may incur errors or performance issues due to, for example, varying environmental conditions. For example, extreme environmental conditions (such as temperatures) or disparities in those conditions between access operations may result in relatively high error rates, increased latency, and the like. For instance, differences between a temperature of a memory system when writing data and a temperature of the memory system when reading the data may cause errors, for example, by affecting a voltage used to read and write the data. Compensating for such differences in temperature to reduce read errors may be difficult, as the temperature of the memory system when writing data may be unknown to the memory system when the data is read. Further, storing temperature values of the memory system along with data (e.g., storing integer values of a temperature of the memory system when data is written) may increase signaling overhead and reduce storage space of the memory system that is available for data. For example, it may take a larger quantity of bits to store a representation of a temperature value that it does to store a representation of a range of temperatures that includes the temperature value (e.g., quantization of the temperature values).

In accordance with examples as disclosed herein, a memory system may write (e.g., record) temperature information to metadata during a write operation at a location that is representative of a temperature of the memory system during the write operation. For example, the temperature information may indicate a range of temperatures that the temperature of the memory system is within during the write operation. The memory system may read the temperature information during a subsequent read operation at the location and adjust one or more parameters (e.g., trim parameters) of the read operation based on the temperature information and a temperature of the memory system during the read operation. For example, the memory system may select a set of trim parameters for performing the read operation to mitigate or reduce errors that may result from temperature differences during the write operation and the read operation.

The memory system may write temperature information to metadata in accordance with a configuration indicated by a server (e.g., a remote server). For example, the server may collect information from one or more memory systems including temperatures of the one or more memory systems during write operations and corresponding read operations and whether the read operations failed. Based on the collected information, the server may determine a set of temperature ranges and a quantity of temperature bits and temperature parity bits that may be used to indicate a temperature range of the set, and the server may indicate the set of temperature ranges and the quantity of the temperature bits and temperature parity bits for use by the memory system. For example, during a write operation, the memory system may determine which temperature range a temperature of the memory system is within and write temperature bits and temperature panty bits to metadata that correspond to the determined temperature range. In this way, the memory system may store temperature information associated with write operations for use in reducing read operations errors while using a reduced quantity of bits to store the temperature information and storing the temperature information in metadata, thereby reducing signaling overhead.

In some examples, the server may indicate which trim parameters (e.g., reference voltages, access voltages, timing parameters, etc.) the memory system is to use for performing read operations based on temperature information collected from the memory system and a temperature of the memory system. For example, the server may determine and indicate an ordering of the trim parameters based on a temperature of the memory system such that the memory system first uses trim parameters that are less likely to result in read operation errors. Accordingly, latency and power consumption associated with performing read operations may be reduced.

In some examples, the memory system may perform targeted refresh operations at locations of the memory system based on temperature information. For example, the memory system may use the temperature information to refresh (e.g., rewrite) data stored at locations where the data was written while the memory system was at an extreme temperature (e.g., above a high temperature threshold, below a low temperature threshold). The memory system may refresh the data while the memory system is within a relatively normal temperature range (e.g., at or near room temperature). As a result, subsequently reading the refreshed data may be less likely to fail.

Figure 2:
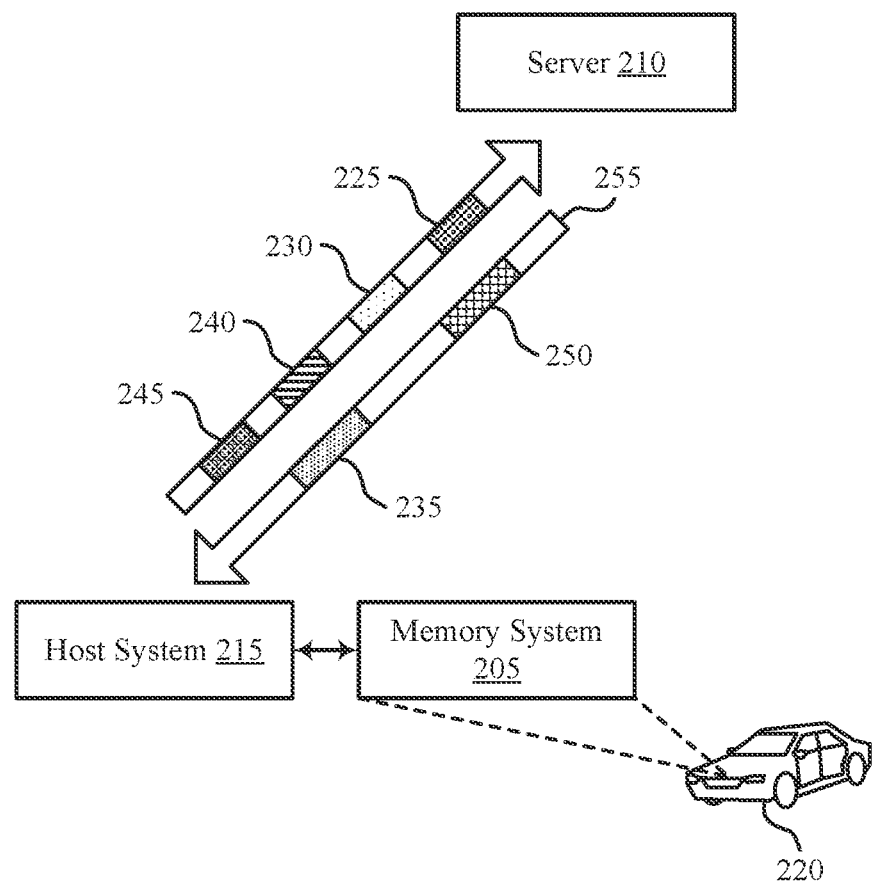
FIG. 2 illustrates an example of a system that supports techniques for temperature-based access operations in accordance with examples as disclosed herein.

Features of the disclosure are initially described in the context of systems with reference to FIGS. 1 through 2. Features of the disclosure are described in the context of temperature diagrams, systems, and a trim diagram with reference to FIGS. 3 through 7. These and other features of the disclosure are further illustrated by and described in the context of an apparatus diagram and flowchart that relate to techniques for temperature-based access operations with reference to FIGS. 8 through 14.

FIG. 1 illustrates an example of a system 100 that supports techniques for temperature-based access operations in accordance with examples as disclosed herein. The system 100 includes a host system 105 coupled with a memory system 110.

A memory system 110 may be or include any device or collection of devices, where the device or collection of devices includes at least one memory array. For example, a memory system 110 may be or include a Universal Flash Storage (UFS) device, an embedded Multi-Media Controller (eMMC) device, a flash device, a universal serial bus (USB) flash device, a secure digital (SD) card, a solid-state drive (SSD), a hard disk drive (HDD), a dual in-line memory module (DIMM), a small outline DIMM (SO-DIMM), or a non-volatile DIMM (NVDIMM), among other possibilities.

The system 100 may be included in a computing device such as a desktop computer, a laptop computer, a network server, a mobile device, a vehicle (e.g., airplane, drone, train, automobile, or other conveyance), an Internet of Things (IoT) enabled device, an embedded computer (e.g., one included in a vehicle, industrial equipment, or a networked commercial device), or any other computing device that includes memory and a processing device.

The system 100 may include a host system 105, which may be coupled with the memory system 110. In some examples, this coupling may include an interface with a host system controller 106, which may be an example of a controller or control component configured to cause the host system 105 to perform various operations in accordance with examples as described herein. The host system 105 may include one or more devices and, in some cases, may include a processor chipset and a software stack executed by the processor chipset. For example, the host system 105 may include an application configured for communicating with the memory system 110 or a device therein. The processor chipset may include one or more cores, one or more caches (e.g., memory local to or included in the host system 105), a memory controller (e.g., NVDIMM controller), and a storage protocol controller (e.g., peripheral component interconnect express (PCIe) controller, serial advanced technology attachment (SATA) controller). The host system 105 may use the memory system 110, for example, to write data to the memory system 110 and read data from the memory system 110. Although one memory system 110 is shown in FIG. 1, the host system 105 may be coupled with any quantity of memory systems 110.

The host system 105 may be coupled with the memory system 110 via at least one physical host interface. The host system 105 and the memory system 110 may, in some cases, be configured to communicate via a physical host interface using an associated protocol (e.g., to exchange or otherwise communicate control, address, data, and other signals between the memory system 110 and the host system 105). Examples of a physical host interface may include, but are not limited to, a SATA interface, a UFS interface, an eMMC interface, a PCIe interface, a USB interface, a Fiber Channel interface, a Small Computer System Interface (SCSI), a Serial Attached SCSI (SAS), a Double Data Rate (DDR) interface, a DIMM interface (e.g., DIMM socket interface that supports DDR), an Open NAND Flash Interface (ONFI), and a Low Power Double Data Rate (LPDDR) interface. In some examples, one or more such interfaces may be included in or otherwise supported between a host system controller 106 of the host system 105 and a memory system controller 115 of the memory system 110. In some examples, the host system 105 may be coupled with the memory system 110 (e.g., the host system controller 106 may be coupled with the memory system controller 115) via a respective physical host interface for each memory device 130 included in the memory system 110, or via a respective physical host interface for each type of memory device 130 included in the memory system 110.

The memory system 110 may include a memory system controller 115 and one or more memory devices 130. A memory device 130 may include one or more memory arrays of any type of memory cells (e.g., non-volatile memory cells, volatile memory cells, or any combination thereof). Although two memory devices 130-a and 130-b are shown in the example of FIG. 1, the memory system 110 may include any quantity of memory devices 130. Further, if the memory system 110 includes more than one memory device 130, different memory devices 130 within the memory system 110 may include the same or different types of memory cells.

The memory system controller 115 may be coupled with and communicate with the host system 105 (e.g., via the physical host interface) and may be an example of a controller or control component configured to cause the memory system 110 to perform various operations in accordance with examples as described herein. The memory system controller 115 may also be coupled with and communicate with memory devices 130 to perform operations such as reading data, writing data, erasing data, or refreshing data at a memory device 130-among other such operations-which may generically be referred to as access operations. In some cases, the memory system controller 115 may receive commands from the host system 105 and communicate with one or more memory devices 130 to execute such commands (e.g., at memory arrays within the one or more memory devices 130). For example, the memory system controller 115 may receive commands or operations from the host system 105 and may convert the commands or operations into instructions or appropriate commands to achieve the desired access of the memory devices 130. In some cases, the memory system controller 115 may exchange data with the host system 105 and with one or more memory devices 130 (e.g., in response to or otherwise in association with commands from the host system 105). For example, the memory system controller 115 may convert responses (e.g., data packets or other signals) associated with the memory devices 130 into corresponding signals for the host system 105.

The memory system controller 115 may be configured for other operations associated with the memory devices 130. For example, the memory system controller 115 may execute or manage operations such as wear-leveling operations, garbage collection operations, error control operations such as error-detecting operations or error-correcting operations, encryption operations, caching operations, media management operations, background refresh, health monitoring, and address translations between logical addresses (e.g., logical block addresses (LBAs)) associated with commands from the host system 105 and physical addresses (e.g., physical block addresses) associated with memory cells within the memory devices 130.

The memory system controller 115 may include hardware such as one or more integrated circuits or discrete components, a buffer memory, or a combination thereof. The hardware may include circuitry with dedicated (e.g., hard-coded) logic to perform the operations ascribed herein to the memory system controller 115. The memory system controller 115 may be or include a microcontroller, special purpose logic circuitry (e.g., a field programmable gate array (FPGA), an application specific integrated circuit (ASIC), a digital signal processor (DSP)), or any other suitable processor or processing circuitry.

The memory system controller 115 may also include a local memory 120. In some cases, the local memory 120 may include read-only memory (ROM) or other memory that may store operating code (e.g., executable instructions) executable by the memory system controller 115 to perform functions ascribed herein to the memory system controller 115. In some cases, the local memory 120 may additionally or alternatively include static random access memory (SRAM) or other memory that may be used by the memory system controller 115 for internal storage or calculations, for example, related to the functions ascribed herein to the memory system controller 115. Additionally or alternatively, the local memory 120 may serve as a cache for the memory system controller 115. For example, data may be stored in the local memory 120 if read from or written to a memory device 130, and the data may be available within the local memory 120 for subsequent retrieval for or manipulation (e.g., updating) by the host system 105 (e.g., with reduced latency relative to a memory device 130) in accordance with a cache policy.

Although the example of the memory system 110 in FIG. 1 has been illustrated as including the memory system controller 115, in some cases, a memory system 110 may not include a memory system controller 115. For example, the memory system 110 may additionally or alternatively rely upon an external controller (e.g., implemented by the host system 105) or one or more local controllers 135, which may be internal to memory devices 130, respectively, to perform the functions ascribed herein to the memory system controller 115. In general, one or more functions ascribed herein to the memory system controller 115 may, in some cases, be performed instead by the host system 105, a local controller 135, or any combination thereof. In some cases, a memory device 130 that is managed at least in part by a memory system controller 115 may be referred to as a managed memory device. An example of a managed memory device is a managed NAND (MNAND) device.

A memory device 130 may include one or more arrays of non-volatile memory cells. For example, a memory device 130 may include NAND (e.g., NAND flash) memory, ROM, phase change memory (PCM), self-selecting memory, other chalcogenide-based memories, ferroelectric random access memory (RAM) (FeRAM), magneto RAM (MRAM), NOR (e.g., NOR flash) memory, Spin Transfer Torque (STT)-MRAM, conductive bridging RAM (CBRAM), resistive random access memory (RRAM), oxide based RRAM (OxRAM), electrically erasable programmable ROM (EEPROM), or any combination thereof. Additionally or alternatively, a memory device 130 may include one or more arrays of volatile memory cells. For example, a memory device 130 may include RAM memory cells, such as dynamic RAM (DRAM) memory cells and synchronous DRAM (SDRAM) memory cells.

In some examples, a memory device 130 may include (e.g., on a same die or within a same package) a local controller 135, which may execute operations on one or more memory cells of the respective memory device 130. A local controller 135 may operate in conjunction with a memory system controller 115 or may perform one or more functions ascribed herein to the memory system controller 115. For example, as illustrated in FIG. 1, a memory device 130-a may include a local controller 135-a and a memory device 130-b may include a local controller 135-b.

In some cases, a memory device 130 may be or include a NAND device (e.g., NAND flash device). A memory device 130 may be or include a memory die 160. For example, in some cases, a memory device 130 may be a package that includes one or more dies 160. A die 160 may, in some examples, be a piece of electronics-grade semiconductor cut from a wafer (e.g., a silicon die cut from a silicon wafer). Each die 160 may include one or more planes 165, and each plane 165 may include a respective set of blocks 170, where each block 170 may include a respective set of pages 175, and each page 175 may include a set of memory cells.

In some cases, a NAND memory device 130 may include memory cells configured to each store one bit of information, which may be referred to as single level cells (SLCs). Additionally or alternatively, a NAND memory device 130 may include memory cells configured to each store multiple bits of information, which may be referred to as multi level cells (MLCs) if configured to each store two bits of information, as tri-level cells (TLCs) if configured to each store three bits of information, as quad-level cells (QLCs) if configured to each store four bits of information, or more generically as multiple-level memory cells. Multiple-level memory cells may provide greater density of storage relative to SLC memory cells but may, in some cases, involve narrower read or write margins or greater complexities for supporting circuitry.

In some cases, planes 165 may refer to groups of blocks 170, and in some cases, concurrent operations may take place within different planes 165. For example, concurrent operations may be performed on memory cells within different blocks 170 so long as the different blocks 170 are in different planes 165. In some cases, an individual block 170 may be referred to as a physical block, and a virtual block 180 may refer to a group of blocks 170 within which concurrent operations may occur. For example, concurrent operations may be performed on blocks 170-a, 170-b, 170-c, and 170-d that are within planes 165-a, 165-b, 165-c, and 165-d, respectively, and blocks 170-a, 170-b, 170-c, and 170-d may be collectively referred to as a virtual block 180. In some cases, a virtual block may include blocks 170 from different memory devices 130 (e.g., including blocks in one or more planes of memory device 130-a and memory device 130-b). In some cases, the blocks 170 within a virtual block may have the same block address within their respective planes 165 (e.g., block 170-a may be "block 0" of plane 165-a, block 170-b may be "block 0" of plane 165-b, and so on). In some cases, performing concurrent operations in different planes 165 may be subject to one or more restrictions, such as concurrent operations being performed on memory cells within different pages 175 that have the same page address within their respective planes 165 (e.g., related to command decoding, page address decoding circuitry, or other circuitry being shared across planes 165).

In some cases, a block 170 may include memory cells organized into rows (pages 175) and columns (e.g., strings, not shown). For example, memory cells in a same page 175 may share (e.g., be coupled with) a common word line, and memory cells in a same string may share (e.g., be coupled with) a common digit line (which may alternatively be referred to as a bit line).

For some NAND architectures, memory cells may be read and programmed (e.g., written) at a first level of granularity (e.g., at the page level of granularity) but may be erased at a second level of granularity (e.g., at the block level of granularity). That is, a page 175 may be the smallest unit of memory (e.g., set of memory cells) that may be independently programmed or read (e.g., programmed or read concurrently as part of a single program or read operation), and a block 170 may be the smallest unit of memory (e.g., set of memory cells) that may be independently erased (e.g., erased concurrently as part of a single erase operation). Further, in some cases, NAND memory cells may be erased before they can be re written with new data. Thus, for example, a used page 175 may, in some cases, not be updated until the entire block 170 that includes the page 175 has been erased.

In some cases, a memory system controller 115 or a local controller 135 may perform operations (e.g., as part of one or more media management algorithms) for a memory device 130, such as wear leveling, background refresh, garbage collection, scrub, block scans, health monitoring, or others, or any combination thereof. For example, within a memory device 130, a block 170 may have some pages 175 containing valid data and some pages 175 containing invalid data. To avoid waiting for all of the pages 175 in the block 170 to have invalid data in order to erase and reuse the block 170, an algorithm referred to as "garbage collection" may be invoked to allow the block 170 to be erased and released as a free block for subsequent write operations. Garbage collection may refer to a set of media management operations that include, for example, selecting a block 170 that contains valid and invalid data, selecting pages 175 in the block that contain valid data, copying the valid data from the selected pages 175 to new locations (e.g., free pages 175 in another block 170), marking the data in the previously selected pages 175 as invalid, and erasing the selected block 170. As a result, the quantity of blocks 170 that have been erased may be increased such that more blocks 170 are available to store subsequent data (e.g., data subsequently received from the host system 105).

The system 100 may include any quantity of non-transitory computer readable media that support techniques for temperature-based access operations. For example, the host system 105, the memory system controller 115, or a memory device 130 (e.g., a local controller 135) may include or otherwise may access one or more non-transitory computer readable media storing instructions (e.g., firmware) for performing the functions ascribed herein to the host system 105, memory system controller 115, or memory device 130. For example, such instructions, if executed by the host system 105 (e.g., by the host system controller 106), by the memory system controller 115, or by a memory device 130 (e.g., by a local controller 135), may cause the host system 105, memory system controller 115, or memory device 130 to perform one or more associated functions as described herein.

In some cases, a memory system 110 may utilize a memory system controller 115 to provide a managed memory system that may include, for example, one or more memory arrays and related circuitry combined with a local (e.g., on-die or in-package) controller (e.g., local controller 135). An example of a managed memory system is a managed NAND (MNAND) system.

In some cases, the host system 105 may be coupled with or otherwise be capable of communicating with a server 185. The host system 105 and the server 185 may communicate through wired or wireless communication. In some instances, the server 185 may send a command to the host system 105 to cause the host system 105 to perform various operations in accordance with examples as described herein. For example, the server 185 may instruct the host system 105 to exchange or otherwise communicate control information, address information, data, or other signals with the memory system 110. In some cases, the server 185 may exchange or otherwise communicate information with the memory system 110 by way of the host system 105 (e.g., communications between the memory system 110 and the server 185 may be routed through the host system 105).

In some instances, the host system 105, the memory system 110, or both may include one or more sensors (e.g., temperature sensors). The sensor(s) may be configured to monitor a temperature of an environment of the system 100, a temperature of one or more memory devices 130 during an access operation, or both. For example, the host system 105 may include a temperature sensor configured to measure (e.g., identify) a temperature of an environment of the system 100 while various access operations are performed on the memory device 130. Additionally or alternatively, the memory system 110 may include a temperature sensor configured to measure a temperature of the memory system 110 or a given memory device 130 while various access operations are performed on the given memory device 130.

Temperature data gathered by the sensor(s) may be used to improve access operations performed by the memory system 110 (e.g., reduce read operation errors), among other benefits. For example, data may be written to a location of a memory device 130 (e.g., a block 170, a page 175, a virtual block 180) while the memory device 130 (e.g., the memory system 110) is at a first temperature (e.g., that is measured by a sensor associated with the memory system 110). The same data may later be read from the location of the memory device 130, which may be at a same or different (e.g., a higher or a lower) temperature than the first temperature when the data is read. In some cases, differences in a temperature of the memory device 130-a when writing data compared to reading the data may cause errors in reading the data. Accordingly, the memory system 110 (e.g., the memory system controller 115) may be configured (e.g., operable) to perform access operations based on a correlation (e.g., a difference) between the first temperature and a second temperature when the data is read. For example, the memory system 110 may perform a read operation using a trim parameter selected based on the difference between the first temperature and the second temperature such that a likelihood of error is reduced.

To support temperature-based access operations, the memory system 110 may be configured to write temperature information to metadata during a write operation at a location that is representative of a temperature of the memory system 110 during the write operation. For example, the temperature information may indicate a range of temperatures that the temperature of the memory system is within during the write operation. The memory system 110 may read the temperature information during a subsequent read operation at the location and adjust one or more parameters (e.g., trim parameters) of the read operation based on the temperature information and a temperature of the memory system during the read operation. For example, the memory system 110 may select a set of trim parameters for performing the read operation to mitigate or reduce errors that may result from temperature differences during the write operation and the read operation.

In some examples, the memory system 110 may write temperature information to metadata in accordance with a configuration indicated by the server 185 (e.g., a remote server), where the configuration is based on information collected from the memory system 110 (e.g., by way of the host system 105). For example, the server 185 may determine and indicate to the memory system 110 a set of temperature ranges and a quantity of temperature bits and temperature parity bits that may be used to indicate a temperature range of the set. During a write operation, the memory system 110 may determine which temperature range a temperature of the memory system 110 is within and write temperature bits and temperature parity bits to metadata that correspond to the determined temperature range. In this way, the memory system 110 may store temperature information associated with write operations for use in reducing read operations errors while using a reduced quantity of bits to store the temperature information and storing the temperature information in metadata, thereby reducing signaling overhead.

In some examples, the server 185 may indicate which trim parameters (e.g., reference voltages, access voltages, timing parameters, etc.) the memory system 110 is to use for performing read operations based on temperature information collected from the memory system and a temperature of the memory system 110. For example, the server may determine and indicate an ordering of the trim parameters based on a temperature of the memory system 110 such that the memory system 110 first uses trim parameters that are less likely to result in read operation errors. Accordingly, latency and power consumption associated with performing read operations may be reduced.

In some examples, the memory system 110 may perform targeted refresh operations at locations of the memory system 110 (e.g., of a memory device 130) based on temperature information. For example, the memory system 110 may use the temperature information to refresh (e.g., rewrite) data stored at locations (e.g., blocks 170, pages 175, virtual blocks 180) where the data was written while the memory system 110 was at an extreme temperature (e.g., above a high temperature threshold, below a low temperature threshold). The memory system 110 may refresh the data while the memory system 110 is within a relatively normal temperature range (e.g., at or near room temperature). As a result, subsequently reading the refreshed data may be less likely to fail.

FIG. 2 illustrates an example of a system 200 that supports techniques for temperature-based access operations in accordance with examples as disclosed herein. The system 200 may implement or be implemented by aspects of the system 100 as described with reference to FIG. 1. For example, the system 200 may include a memory system 205, a server 210, and a host system 215, which may be examples of the corresponding devices described herein, including with reference to FIG. 1.

The system 200 may support communications between the memory system 205, the server 210, and the host system 215. For example, the memory system 205 and the host system 215 may be coupled via one or more physical host interfaces and communicate signaling via the one or more physical host interfaces. Additionally, the host system 215 and the server 210 may communicate signaling via respective communication links 255. In some examples, the communication links 255 may be wireless or wired communication links between the host system 215 and the server 210. In some examples, the memory system 205 and the server 210 may communicate signaling by way of the host system 215. For example, signaling communicated between the memory system 205 and the server 210 may be routed through the host system 215. In some other examples, the system 200 may support direct communications between the memory system 205 and the server 210, for example, via communication links 255 between the memory system 205 and the server 210 (not shown).

In some cases, the memory system 205 (e.g., components or memory devices included in the memory system 205) may experience a range of operating temperatures. Differences between a temperature of the memory system 205 when writing data and a temperature of the memory system 205 when reading the data may cause errors (e.g., increase a likelihood that errors occur), for example, by affecting a voltage at which the data is read and written. Similarly, performing read and write operations while experiencing extreme operating temperatures may result in higher rates of error relative to performing the read and write operations at non-extreme operating temperatures. In some cases, the memory system 205 may be a part of (e.g., included in or otherwise coupled with) a vehicle 220. The vehicle 220 may experience wider ranges of operating temperatures than other memory systems 205 (e.g., in personal computers), and a memory system 205 included in the vehicle 220 may be more prone to read errors while reading data as a result. Thus, it may be beneficial for components of the system 200 to measure and record information (e.g., temperature, time, address, size, error indicators, etc.) and generate procedures based on the information to reduce error incidence in the memory system 205.

For example, the memory system 205 (or the host system 215) may measure a temperature of the memory system 205 during a write operation (e.g., using a temperature sensor) and write temperature information associated with (e.g., indicative of) the measured temperature to metadata corresponding to the write operation. In some implementations, the memory system 205 may determine a temperature range of a set of temperature ranges within which the measured temperature is included. Based on the temperature range determination, the memory system 205 may write one or more temperature bits to the metadata that correspond to (e.g., that indicate) the determined temperature range. Additionally, the memory system 205 may write one or more bits to the metadata that may serve as parity bits for the temperature bits (e.g., temperature parity bits) to support error correction of the temperature bits during a subsequent read of the metadata.

Parameters for recording temperatures of the memory system 205 (e.g., writing temperature information to metadata), such as threshold temperature values for separating respective temperature ranges of the set of temperature ranges, temperature bit value combinations corresponding to each temperature range in the set, and a quantity of bits allocated in the metadata for the temperature bits and the temperature parity bits, among other parameters described herein, may be configured by the server 210. In some examples, the memory system 205 may be configured by the server 210 to write temperature information to metadata according to a basic mode, where the parameters for writing the temperature information may correspond to a default or baseline configuration. In some examples, the memory system 205 may be configured to write temperature information to metadata according to a data-driven mode, where the parameters for writing the temperature information may be determined by the server 210 using information from the memory system 205.

The memory system 205 may use temperature information written to metadata during a write operation at a location in performing a subsequent read operation to read data written to the location. For example, the memory system 205 may read the temperature information during the subsequent read operation at the location and adjust one or more parameters, such as trim parameters, of the read operation based on the temperature information written to the metadata and a temperature of the memory system 205 during the read operation. For example, the memory system 205 may select a trim parameter (e.g., a set of trim parameters) for performing the read operation based on a difference (e.g., or lack thereof) between a temperature range indicated by the temperature information written to the metadata and a temperature range within which the temperature of the memory system 205 during the read operation is. In this way, the memory system 205 may mitigate or reduce errors that may result from temperature differences during the write operation and the read operation.

To support temperature-based access operations, the memory system 205 may transmit (e.g., send) information to the server 210 (e.g., via the host system 215). For example, the memory system 205 may transmit write information 225, read information 230, temperature information 240, priority information 245, or a combination thereof, to the server 210. The server 210 may utilize the information received from the memory system 205 to determine operating parameters for the memory system 205 to use in performing access operations. For example, the server 210 may transmit a temperature indication 235 to the memory system 205 that indicates the parameters for writing temperature information to metadata, where the parameters may be determined using the information (e.g., the read information 230, the write information 225) received from the memory system 205. Additionally or alternatively, the server 210 may transmit a trim indication 250 to the memory system 205 that indicates a trim parameter (e.g., an ordering of a set of trim parameters) to use in performing a read operation, where the trim parameter (e.g., the ordering of the set of trim parameters) may be determined using the information (e.g., the temperature information 240, the priority information 245) received from the memory system 205.

The server 210 may perform a procedure for determining the parameters indicated by the temperature indication 235. For example, the server 210 may use the write information 225 and the read information 230 received from the memory system 205 to determine the parameters for writing temperature information to metadata. The write information 225 may include times (e.g., and dates), addresses (e.g., locations of the memory system 205), sizes (e.g., quantities of bytes of data), temperature values of the memory system 205, or a combination thereof, that are associated with write operations at (e.g., performed by) the memory system 205. The read information 230 may include times, addresses, sizes, temperature values, error indications, or a combination thereof, that are associated with read operations at (e.g., performed by) the memory system 205 corresponding to the write operations (e.g., corresponding to the locations for the write operations). Using the write information 225 and the read information 230, the server 210 may determine the set of temperature ranges and the quantity of temperature bits and temperature parity bits to include in the metadata. For example, the server 210 may determine the parameters for writing (e.g., recording) temperature information based on differences in temperature values between corresponding write operations and read operations and whether a corresponding error indication indicates that the read operation failed. Additional details related to the procedure for determining parameters for writing temperature information are described with reference to FIGS. 3 and 4 below. The server 210 may communicate the determined parameters for writing temperature information in a temperature indication 235 transmitted to the memory system 205.

The server 210 may perform a procedure for determining the trim parameter (e.g., the ordering of trim parameters) indicated by the trim indication 250 using the temperature information 240, the priority information 245, or a combination thereof. For example, the temperature information 240 may include a temperature (e.g., or a temperature range) of the memory system 205 during a set of write operations to locations of the memory system 205. The priority information 245 may include priority values corresponding to respective data written to the locations during the set of write operations. Using the temperature information 240, the priority information 245, or a combination thereof, the server 210 may determine the trim parameter (e.g., the ordering of the trim parameters). For example, the server 210 may determine a score for the trim parameter (e.g., each of the trim parameters) associated with performing read operations to the locations based on a probability that using the trim parameter to perform the read operations causes the read operations to fail when the memory system is at a given temperature. The probability that the read operations fail may be based on a difference in temperatures of the memory system 205 during a write operation and a corresponding read operation. In some examples, the score may further be based on the priority values indicated by the priority information 245. Additional details related to the procedure for determining the trim parameter are describe with reference to FIGS. 5 and 6 below. The server 210 may communicate the determined trim parameter (e.g., the ordering of the trim parameters) in a trim indication 250 transmitted to the memory system 205.

In some cases, the memory system 205 may be configured to perform a refresh event based on a current temperature of the memory system 205 and temperature information stored by the memory system 205. For example, the memory system 205 may determine that the current temperature is within (e.g., between) a range of temperatures (e.g., at or near room temperature, such as between 20° C. and 22° C., among other temperature ranges including non-extreme temperatures). The memory system 205 may determine (e.g., identify) a number of locations (e.g., blocks 170, pages 175, logical block addresses (LBAs)) where data is stored and was written at an extreme temperature (e.g., lower than a first threshold temperature or higher than a second threshold temperature), for example, based on temperature information written to metadata corresponding to the data. The memory system 205 may perform a refresh operation to refresh (e.g., rewrite) the data corresponding to (e.g., stored at) the identified locations while the current temperature of the memory system 205 is within the range of temperatures, which may reduce a likelihood that subsequent reading of the refreshed data fails. In some implementations, the memory system 205 may perform the refresh operation at idle times (e.g., when the memory system 205 is in an idle state, during garbage collection or some other media management operation).

Figure 3:
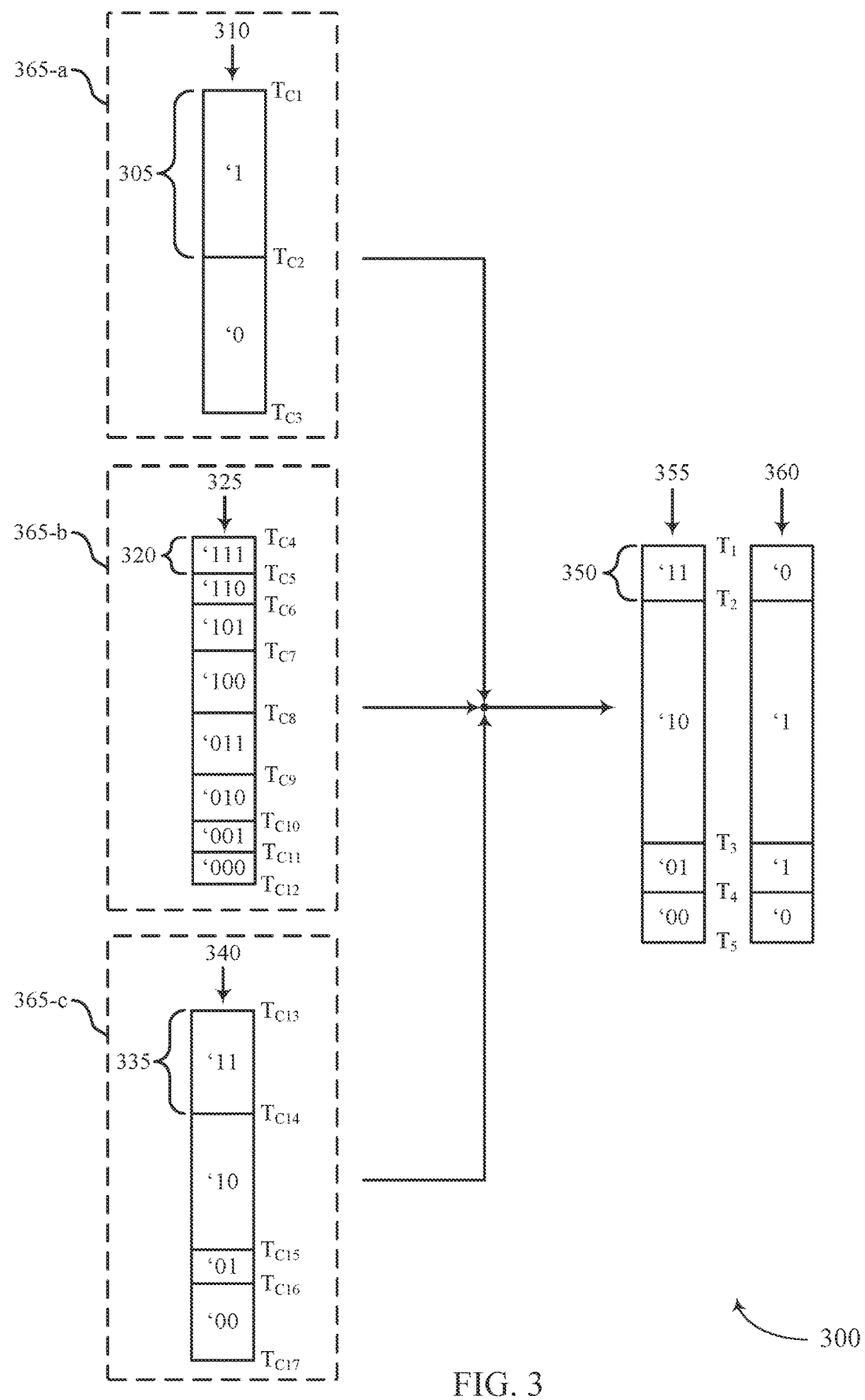
FIGS. 3 and 4 illustrate examples of temperature range diagrams that support techniques for temperature-based access operations in accordance with examples as disclosed herein.

FIG. 3 illustrates an example of a temperature range diagram 300 that supports techniques for temperature-based access operations in accordance with examples as disclosed herein. The temperature range diagram 300 may implement or be implemented by aspects of the systems 100 and 200 as described with reference to FIGS. 1 and 2, respectively. For example, aspects of the temperature range diagram 300 may be implemented by a server or a memory system, which may be examples of the corresponding devices described herein, including with reference to FIGS. 1 and 2. The server and the memory system may implement aspects of the temperature range diagram 300 to implement a data-driven mode for storing and utilizing temperature information, which may reduce access operation errors and enable the compressed storage of temperature information, among other benefits.

A memory system (e.g., a memory system 110, a memory system 205) may be capable of writing temperature values measured during write operations to improve access operation performance. However, if the memory system records integer values of the temperature of the memory system during each write operation, the memory system may incur significant signaling overhead and reduction in storage space available for data storage as such recording may require the signaling and storage of a significant quantity of bits. Thus, it may be desirable to compress the quantity of bits used for storing temperature information.

The memory system may be configured by a server (e.g., a server 185, a server 210) with a set of temperature ranges 350 and a quantity of temperature bits 355 and temperature parity bits 360 for use in writing temperature information to metadata. For example, the memory system may write a quantity of temperature bits 355 and a quantity of temperature parity bits 360 to metadata (associated with the host data being stored by the write operation) during a write operation based on the set of temperature ranges 350 and in accordance with the configuration. The set of temperature ranges 350 may be separated by threshold temperatures $T_N$. In the example of FIG. 3, the set of temperature ranges 350 may include four temperature ranges 350 including: a first temperature range 350 between threshold temperatures $T_1$ and $T_2$ (e.g., spanning from $T_1$ to $T_2$), a second temperature range 350 between threshold temperatures $T_2$ and $T_3$, a third temperature range 350 between threshold temperatures $T_3$ and $T_4$, and a fourth temperature range 350 between threshold temperatures $T_4$ and $T_5$. That is, the threshold temperatures $T_N$ may be used to define and separate the respective temperature ranges 350. In some examples, a maximum temperature of the set of temperature ranges 350 (e.g., $T_1$) and a minimum temperature of the set of temperature ranges 350 (e.g., $T_5$) may be configured as temperatures at or past the operating limits of the memory system such that a temperature of the memory system may not exceed $T_1$ or be below 15. In some examples, the threshold temperatures $T_N$ that separate two respective temperature ranges 350 may be assigned to be included in one of the temperature ranges 350. For example, $T_2$ may be included in the first temperature range 350 or the second temperature range, $T_3$ may be included in the second temperature range 350 or the third temperature range 350, and $T_4$ may be included in the third temperature range 350 or the fourth temperature range 350. It is noted that the techniques described herein may be adapted and applied such that the set of temperature ranges 350 may include any quantity of temperature ranges 350 separated by any corresponding quantity of threshold temperatures $T_N$.

In accordance with the configuration, the memory system may associate certain logical bit values (e.g., a given combination of bit values) of the temperature bits 355 with a corresponding temperature range 350. For example, the example of FIG. 3 illustrates that the configured quantity of temperature bits 355 to be written to metadata may be two, although any quantity of temperature bits 355 may be configured by the server. In an example, a logical bit value of '11 may indicate a temperature value within the first temperature range 350 (e.g., below $T_1$ and above temperature $T_2$), a logical bit value of '10 may indicate a temperature value within the second temperature range 350, a logical bit value of '01 may indicate a temperature value within the third temperature range 350, and a logical bit value of '00 may indicate a temperature value within the fourth temperature range 350. That is, if the memory system determines that the temperature of the memory system (e.g., a memory device of the memory system) is between $T_2$ and $T_3$ during a write operation, the memory system may write the logical bit value of '10 to a portion of the metadata that stores the temperature bits 355.

Additionally, the memory system may associate certain logical bit values of the temperature parity bits 360 with a corresponding temperature range 350. For example, the example of FIG. 3 illustrates that the configured quantity of temperature parity bits 360 to be written to metadata may be one, although any quantity of temperature parity bits 360 may be configured by the server. In an example, a logical bit value of '0 may correspond to the first temperature range 350, a logical bit value of '1 may correspond to the second temperature range 350, a logical bit value of 1 may correspond to the third temperature range 350, and a logical bit value of '0 may correspond to the fourth temperature range 350. That is, if the memory system determines that the temperature of the memory system (e.g., a memory device of the memory system) is between $T_2$ and $T_3$ during a write operation, the memory system may write the logical bit value of '1 to a portion of the metadata that stores the temperature parity bits 360 (e.g., to support error correction of the temperature bits 355).

Reducing the quantity of temperature bits 355 and temperature parity bits 360 used to store the temperature information may reduce the space utilized for storing the temperature information, though also reducing the quantity of temperature ranges 350. Thus, a tension may arise between reducing the quantity of temperature bits 355 and temperature parity bits 360 to save space, and increasing the quantity of temperature bits 355 and temperature parity bits 360 to record temperature information at a higher level of granularity (e.g., higher level of precision or accuracy) provided by having more temperature ranges 350.

The temperature range diagram 300 depicts an example procedure performed by the server to configure the memory system with the temperature ranges 350, the temperature bits 355, and the temperature parity bits 360 such that storage space utilization and precision in recording temperature values may be balanced. For example, the server may use information received from one or more memory systems to determine candidate temperature ranges $T_{CN}$, candidate temperature bits, and candidate temperature parity bits that may be used to determine the set of temperature ranges 350 and the quantities of temperature bits 355 and temperature parity bits 360. For instance, the memory system may transmit write information (e.g., write information 225) to the server that includes time values, address values, size values, and temperature values associated with a set of write operations at locations of the memory system. The memory system may also transmit read information (e.g., read information 230) to the server that includes time values, address values, size values, temperature values, and error indications (e.g., an indication of whether a read operation failed) associated with a set of read operations corresponding to the locations for the set of write operations.

Using the write information and the read information, the server may categorize the write information and the read information for different locations of the memory system into groups 365. For example, each group 365 may correspond to read operations and write operations categorized into delta-time bins based on a difference in time between a write operation and a corresponding read operation. For instance, in the example of FIG. 3, the server may categorize write operation and read operation pairs having a time difference within a first delta-time range (e.g., 0 to 2 days) into a group 365-a, write operation and read operation pairs having a time difference within a second delta-time range (e.g., 3 to 10 days) into a group 365-b, and write operation and read operations pairs having a time difference within a third delta-time range (e.g., 11 days or more) into a group 365-c (e.g., although the server may categorize write operation and read operation pairs into any quantity of groups 365 corresponding to respective delta-time ranges). Within each group 365, the server may further categorize write operation and read operation pairs into delta-temperature bins (e.g., delta-temperature ranges, such as –40) based on a difference in temperature at write time and at read time.

Based on the categorizations, the server may generate a set of candidate temperature ranges, candidate threshold temperature values that separate each set of temperature ranges, and a candidate quantity of temperature bits for each group 365. For example, for the group 365-a, the server may determine to use one temperature bit 310, which may support two candidate temperature ranges 305. For group 365-b, the server may determine to use three temperature bits 325, which may support up to eight candidate temperature ranges 320. For group 365-c, the sever may determine to use two temperature bits 340, which may support up to four candidate temperature ranges 335. The server may also determine candidate threshold temperatures (e.g., $T_{C1\text{-}17}$) to separate each of the candidate temperature ranges.

To determine the set of candidate temperature ranges, candidate threshold temperatures $T_{CN}$, and the candidate quantity of temperature bits for each group 365, the server may consider the distribution of error indications (e.g., the indication that a read event failed) as a function of the difference in temperatures for each write operation and read operation pair. For example, the server may use a greedy method to assign candidate threshold temperatures separating candidate temperature ranges for a given quantity of temperature ranges. For instance, the server may assign candidate threshold temperatures $T_{C1}$, $T_{C2}$, and $T_{C3}$ to separate candidate temperature ranges 305 in group 365-a. To determine the candidate threshold temperatures for group 365-a, the server may iterate through a number of combinations of candidate threshold temperatures $T_{C1}$, $T_{C2}$, and $T_{C3}$. The server may assign a score to each combination, where a higher score may correspond to a smaller range of a quantity of error indication values within each candidate temperature range 305 that indicate that a read operation failed. In some cases, a failure of a read operation may correspond to an uncorrectable error in reading data stored at the location as part of the corresponding write operation. The server may stop iterating once an improvement in score for the candidate threshold temperatures is less than a threshold. The server may increase the number of candidate temperature ranges 305 by increasing the candidate quantity of temperature bits 310 and repeat the iterative process of finding candidate threshold temperatures for different candidate quantities of temperature bits. The server repeat this process and continue increasing the candidate quantity of temperature bits 310 until the determined improvement in the score for the candidate threshold temperatures is less than a threshold. In the example of group 365-a, the server may determine that the improvement in score between using one temperature bit 310 and two temperature bits 310 is less than a threshold. Accordingly, for group 365-a, the server may determine a set of two candidate temperature ranges 305 separated by the candidate threshold temperatures $T_{C1}$, $T_{C2}$, and $T_{C3}$ and may store (e.g., cache) a vector including the candidate threshold temperatures $T_{C1}$, $T_{C2}$, and $T_{C3}$.

Similarly, the server may use the greedy method to determine the set of candidate temperature ranges, candidate threshold temperatures $T_{CN}$, and the candidate quantity of temperature bits for group 365-b and group 365-c. For example, for group 365-b, the server may use the greedy method to determine a candidate quantity of three temperature bits 325 to support the set of eight candidate temperature ranges 320. The server may determine candidate threshold temperatures $T_{C4}$, $T_{C5}$, $T_{C6}$, $T_{C7}$, $T_{C8}$, $T_{C9}$, $T_{C10}$, $T_{C11}$, and $T_{C12}$ to separate the candidate temperature ranges 320 and may store a vector including the candidate threshold temperatures $T_{C4}$, $T_{C5}$, $T_{C6}$, $T_{C7}$, $T_{C8}$, $T_{C9}$, $T_{C10}$, $T_{C11}$, and $T_{C12}$. For group 365-c, the server may use the greedy method to determine a candidate quantity of two temperature bits 340 to support the set of four candidate temperature ranges 335. The server may determine candidate threshold temperatures $T_{C13}$, $T_{C14}$, $T_{C15}$, $T_{C16}$, and $T_{C17}$ to separate the candidate temperature ranges 335 and may store a vector including the candidate threshold temperatures $T_{C13}$, $T_{C14}$, $T_{C15}$, $T_{C16}$, and $T_{C17}$.

The server may combine the candidate sets of parameters for each group 365 to determine a final set of parameters for use by the memory system. For example, the server may combine the vectors of candidate threshold temperatures $T_{CN}$ into a single vector, which may result in a vector of candidate temperature ranges separated by the candidate threshold temperatures $T_{C1}$ through $T_{C17}$. The server may be configured to iteratively merge two candidate temperature ranges in the vector of candidate temperature ranges to determine the set of temperature ranges 350. For example, the server may select a smallest temperature range and merge it with its smallest neighbor temperature range in the vector of temperature ranges. The server may recalculate the scores for the set of parameters after merging the selected temperature ranges and evaluate the resulting reduction in score. The server may determine that the reduction in score is less than a threshold value and continue merging temperature ranges in the vector of temperature ranges until the reduction in score meets or exceeds the threshold value. In the example of FIG. 3, the server may select the threshold temperatures $T_1$, $T_2$, $T_3$, $T_4$ and $T_5$ based on merging the candidate temperature ranges to determine the set of temperature ranges 350. The server may determine the quantity of temperature bits 355 such that the set of temperature ranges 350 is supported and assign different bit values of the temperature bits 355 to respective temperature ranges 350.

The server may determine a quantity of temperature parity bits 360 to include in metadata based on the read information. The temperature parity bits 360 may provide error control information for the temperature bits. In some examples, the server may determine a total quantity of error indications in the read information that indicate that respective read operations failed. Based on the total quantity of error indications that indicate read operation failure, the server may determine the quantity of temperature parity bits 360 and assign bit values of the temperature parity bits 360 to temperature ranges 350. In some examples, the quantity of temperature parity bits 360 may increase as the total quantity of error indications that indicate read operation failure increases. In the example of FIG. 3, the server may determine that include one temperature parity bit 360 in metadata and may assign a bit value of '0 for the temperature parity bit 360 to the first temperature range 350, a bit value of '1 for the temperature parity bit 360 to the second temperature range 350, the bit value of '1 to the third temperature range 350, and the bit value of '0 to the fourth temperature range 350.

The server may communicate an indication of the determined temperature ranges 350 (e.g., the determined threshold temperatures $T_N$), the determined quantity of temperature bits 355, the determined quantity of temperature parity bits 360 to the memory system (or a host system coupled with the memory system), the threshold temperatures between the different temperature ranges 350, or any combination thereof. The server may also indicate the bit value combinations of the temperature bits 355 that correspond to each temperature range 350 (e.g., an indexed mapping between temperature bits and temperature ranges). In some examples, the indication may be an example of a temperature indication 235 described with reference to FIG. 2.

The memory system may perform access operations in accordance with the parameters configured and indicated by the server. For example, during a write operation, the memory system may determine which temperature range 350 a temperature of the memory system is within and write temperature bits 355 and temperature parity bits 360 to metadata that correspond to the determined temperature. In some examples, the metadata written as part of the write operation may include parity bits for error correction of data written as part of the write operation. For example, a portion of the parity bits used in error correction codes may be reserved to encode the temperature information. For instance, if the metadata is configured to include 10 parity bits for error correction of data, in the example of FIG. 3, three of the 10 parity bits may instead be reserved and used to encode the temperature bits 355 and the temperature parity bits 360. That is, the writing of the temperature bits 355 and the temperature parity bits 360 may take metadata storage space from other applications such as error correction of data.

During a read operation, the memory system may use the temperature information written to the metadata to improve read operation performance. For example, the memory system may select a trim parameter for use in the read operation based on the temperature information and a temperature of the memory system during the read operation. In some examples, the memory system may select the trim parameter based on a given temperature range pair. For example, if the temperature of the memory system during the read operation is between 12 and 13 and the temperature bits 355 written to the metadata are '10 corresponding to the second temperature range 350, the memory system may determine that the temperatures of the memory system during the write operation and the read operation is within the same temperature range 350 and select a first trim parameter for performing the read operation. Alternatively, the memory system may determine that the temperatures of the memory system during the write operation and the read operation are within different temperature ranges 350 and select a second trim parameter for performing the read operation such that an effect of the difference in temperature between the read operation and the write operation is reduced.

Figure 4:
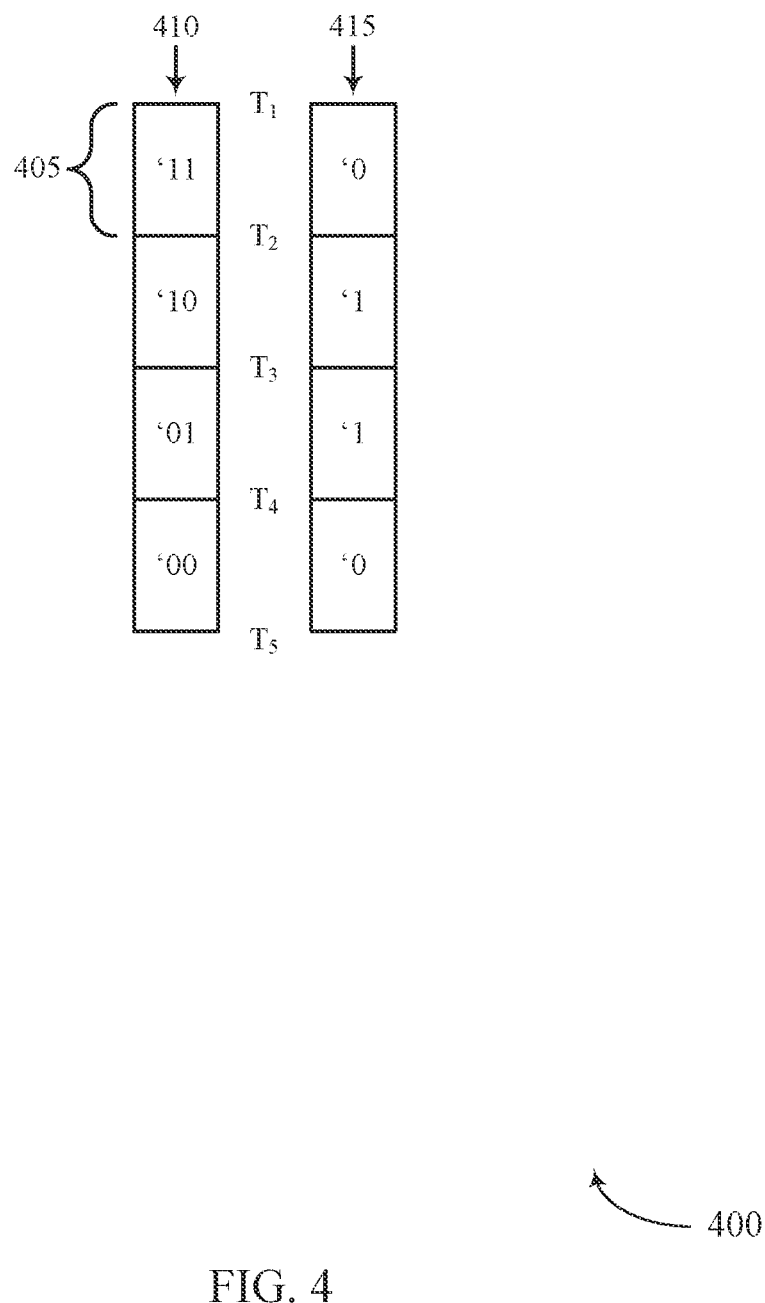

FIG. 4 illustrates an example of a temperature range diagram 400 that supports techniques for temperature-based access operations in accordance with examples as disclosed herein. The temperature range diagram 400 may implement or be implemented by aspects of the systems 100 and 200 as described with reference to FIGS. 1 and 2, respectively. For example, aspects of the temperature range diagram 400 may be implemented by a server or a memory system, which may be examples of the corresponding devices described herein, including with reference to FIGS. 1 and 2. The server and the memory system may implement aspects of the temperature range diagram 400 to implement a basic mode for storing and utilizing temperature information, which may reduce access operation errors and enable the compressed storage of temperature information, among other benefits.

In some cases, a server (e.g., a server 185, a server 210) may configure a memory system (e.g., a memory system 110, a memory system 205) to write (e.g., record) temperature information to metadata according to a basic mode. For example, the server may configure the memory system to use a default, or baseline, set of parameters for recording temperature information. The default set of parameters may include a default set of temperature ranges 405 separated by a default set of threshold temperatures $T_N$. For example, default threshold temperatures $T_1$, $T_2$, $T_3$, $T_4$ and $T_5$ may be used to separate four default temperature ranges 405 associated with the basic mode. Additionally, the default set of parameters may include a default quantity of temperature bits 410 and a default quantity of temperature parity bits 415 (e.g., and the bit value combinations used to indicate each default temperature range 405) that are to be written to metadata in order to store temperature information during a write operation. In some examples, the default threshold temperatures $T_N$ may be spread out evenly throughout a temperature operation range of the memory system. For example, the default threshold temperatures $T_N$ may be set such that the default temperature ranges 405 span a same quantity of temperatures. In some other examples, the default temperature ranges 405 may span different quantities of temperatures.

When operating in basic mode, the memory system may write temperature information to metadata in accordance with the default set of parameters. For example, during a write operation, the memory system may determine which temperature range 405 a temperature of the memory system is within and write temperature bits 410 and temperature parity bits 415 to metadata that correspond to the determined temperature. The memory system may also determine the temperature range 405 during a subsequent read operation in accordance with the default set of parameters.

In some examples, the server may transmit an indication (e.g., a temperature indication 235) to the memory system for the memory system to operate according to the basic mode. In some examples, the server may transmit the indication without reception of write information or read information from the memory system. That is, in the absence of the write information or read information communicated by the memory system, the server may indicate for the memory system to operate according to the basic mode.

Figure 5:
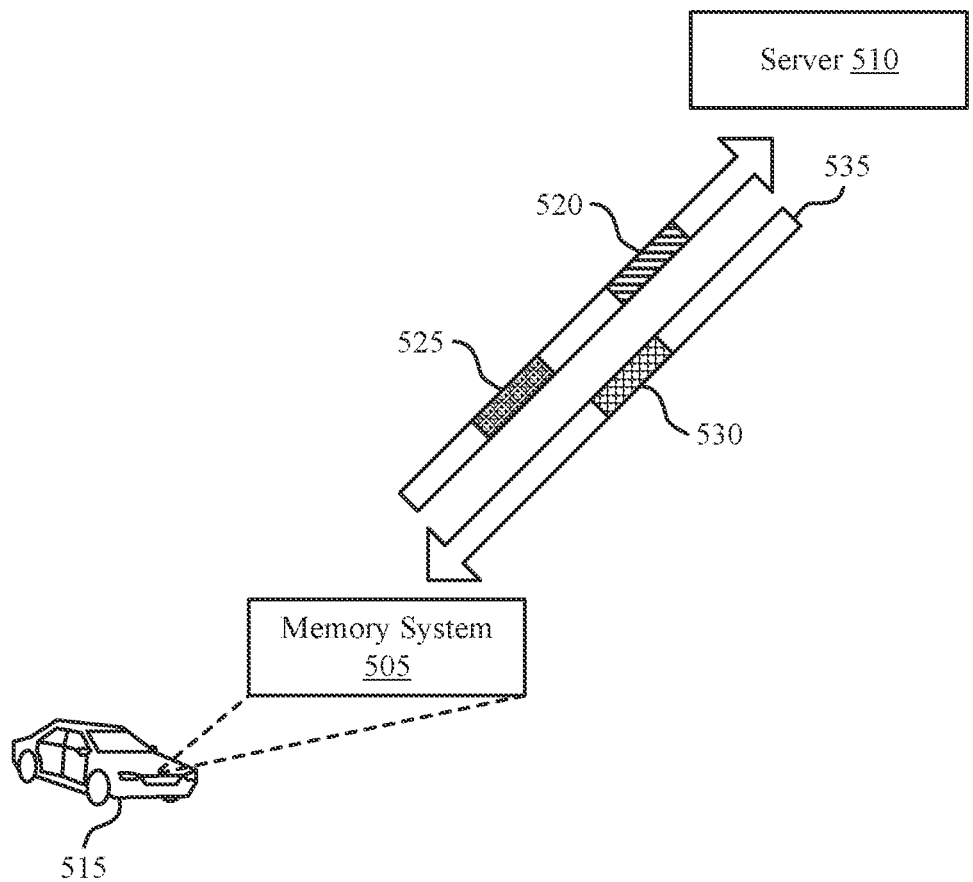
FIG. 5 illustrates an example of a system that supports techniques for temperature-based access operations in accordance with examples as disclosed herein.

FIG. 5 illustrates an example of a system 500 that supports techniques for temperature-based access operations in accordance with examples as disclosed herein. The system 500 may implement or be implemented by aspects of the systems 100 and 200 as described with reference to FIGS. 1 and 2, respectively. For example, aspects of the system 500 may be implemented by a server 510 or a memory system 505, which may be examples of the corresponding devices described herein, including with reference to FIGS. 1 through 4.

The system 500 may support communications between the memory system 505 and the server 510. For example, the memory system 505 and the server 510 may communicate via respective communication links 535 (e.g., by way of a host system), which may be examples of communication links 255 described with reference to FIG. 2.

The memory system 505 may experience a range of operating temperatures. For example, the memory system 505 may be a part of (e.g., included in or otherwise coupled with) a vehicle 515, which may be exposed to a wide range of temperatures during normal operation. Changes in temperature of the memory system 505 may cause errors when writing and reading data, for example, by affecting a voltage at which the data is read and written. As such, performing read and write operations while experiencing extreme operating temperatures may result in higher rates of error relative to performing the read and write operations at non-extreme operating temperatures. Different trim parameters used by the memory system in performing read operations may result in different rates of error at different operating temperatures. Thus, it may be beneficial for the memory system 505 to use different trim parameters at different operating temperatures to decrease errors during read operations.

The memory system 505 may be configured by the server 510 with a trim parameter based on a temperature of the memory system 505 to reduce a likelihood of read operation failure and reduce read operation latency. A trim parameter may refer to one or more values for reference voltages, access voltages, timing parameters, or other parameters used by the memory system 505 in performing a read operation. In some examples, the memory system 505 may be configured with a set of trim parameters and different trim parameters of the set may be associated with different probabilities of read operation failure based on the temperature of the memory system 505. The server 510 may determine an ordering for the trim parameters of the set of trim parameters at an operating temperature of the memory system 505 using information received from the memory system 505 (e.g., and one or more memory systems 505) such that a probability of read operation success is increased. For example, the server 510 may reorder the trim parameters to reduce read error rates (e.g., associated with reading higher priority blocks) by reordering the trim parameters with respect to temperature.

Reducing the rate of read errors may be reduce read delays (e.g., reduce read operation latency) caused by error correction algorithms (e.g., low-density parity-check) performed by the memory system 505 in case of a read error. For example, the memory system 505 may determine that a read operation failed and decide to perform a read retry. A read retry may refer to an operation that adjusts a trim parameter (e.g., a reference voltage) used to read data and attempts to re-read the data using the adjusted trim parameter (e.g., reference voltage). For example, if the memory system 505 performs a read operation using a first trim parameter and the read operation fails, the memory system may perform the read operation again using a second trim parameter. Read retry operations may be configured to compensate for the charge leakage that occurs due to retention loss or thermal effects, or both. Thus, by ordering trim parameters based on temperature, the trim parameters may be ordered such that read operation success is increased, thereby reducing read retry operation frequency, reducing read retry operation latency, or both. For example, the memory system 505 may avoid performing read retry operations when a read operation is successfully performed using a first ordered trim parameter. Additionally, subsequently ordered trim parameters may increase a likelihood of earlier read retry success, which may enable the memory system 505 may to avoid performing error correction procedures and the read delays caused by such error correction procedures.

To support the ordering of trim parameters based on temperature, the memory system 505 may send information to the server 510. For example, the memory system 505 may transmit temperature information 520 (e.g., temperature information 240) that includes temperature information associated with a set of write operations to locations of the memory system 505. For example, the temperature information 520 may indicate respective temperatures of the memory system 505 during the write operations. In some examples, the temperature information 520 may include metadata for each write operation that includes one or more temperature bits and one or more temperature parity bits used to indicate a temperature range of the memory system 505 during the write operation. That is, the server 510 may read the metadata to determine the temperature range that the memory system 505 was within during each write operation. In some examples, the memory system 505 may also transmit priority information 525 (e.g., priority information 245) that includes priority information associated with data written to the locations as part of the write operations. For example, the priority information 525 may indicate a priority associated with respective data written to the locations. In some examples, the server may receive respective temperature information 520 and priority information 525 transmitted by one or more other memory systems 505 (not shown) for use in determining the ordering of the trim parameters.

Based on the received information the server 510 may calculate (e.g., assign, determine) scores for one or more trim parameters of the set of trim parameters available for use by the memory system 505. For example, for a given trim parameter, the server 510 may calculate one or more different scores with each score corresponding to a different temperature of the memory system 505. Each score may be based on a probability of a read error occurring when using the trim parameter to perform a read operation at one of the locations while the memory system 505 is at the corresponding temperature. Additionally, each score may be based on the received priority information (e.g., priority values) corresponding to the data stored at the locations of the memory system 505. For instance, the server 510 may weigh the determination of scores so that the probability of error in a higher priority location may affect the score by a larger amount. For example, a score for a trim parameter at a temperature may be calculated as the sum of each of the priority values for each location divided by the probability of read errors occurring at the location when using the trim parameter.

In some examples, the server 510 may calculate a vector of scores for each trim parameter of the set of trim parameters, with each score being calculated for a different temperature of the memory system 505. The server 510 may combine the vectors of scores to generate a matrix of scores, with each row of the matrix corresponding to a given trim parameter and each column of the matrix corresponding to a given temperature and including the respective score for each trim parameter at the given temperature.

The server 510 may determine a usage order of the set of trim parameters at the current temperature of the memory system 505 based on the calculated scores. For example, the server 510 may determine the current temperature of the memory system 505 and reorder the trim parameters for performing read operations based on the calculated scores corresponding to the current temperature. The server 510 may transmit an indication of the usage order in a trim indication 530 to the memory system 505 (or a host system coupled with the memory system 505). The trim indication 530 may be an example of trim indication 250 as described with reference to FIG. 2. In some examples, the server 510 may select a trim parameter of the set of trim parameters having a highest score at the current temperature and indicate the selected trim parameter in the trim indication 530 for performing read operations.

In some examples, the current temperature of the memory system 505 may correspond to a temperature of the memory system 505 at a boot time of the memory system 505. For example, the server 510 may read the temperature of the memory system 505 at boot time, determine the trim parameter or the usage order of the set of trim parameters, and transmit the trim indication 530 to the memory system 505 to indicate the trim parameter or the usage order.

The memory system 505 may determine a trim parameter to use in performing read operations (e.g., and an order for subsequent trim parameters to attempt to use in case of read failure) in accordance with the trim indication 530. For example, the memory system 505 may perform a read retry according to a reference voltage specified by a next trim parameter in the usage order, which the server has determined may favorably reduce the probability of a read error occurring at the current temperature of the memory system 505. For instance, the memory system 505 may read data stored at location indicated by a read operation using a first trim parameter (e.g., a first reference voltage) indicated by the trim indication 530. The memory system 505 may determine one or more errors associated with the data read using the first trim parameter (e.g., determine that the read operation using the first trim parameter failed). In accordance with the usage order indicated by the trim indication 530, the memory system 505 may read the data using a second (e.g., next) trim parameter (e.g., a second reference voltage). If the read operation fails again, the memory system 505 may continue to use next trim parameters indicated by the usage order, for example, until the data is read successfully.

Figure 6:
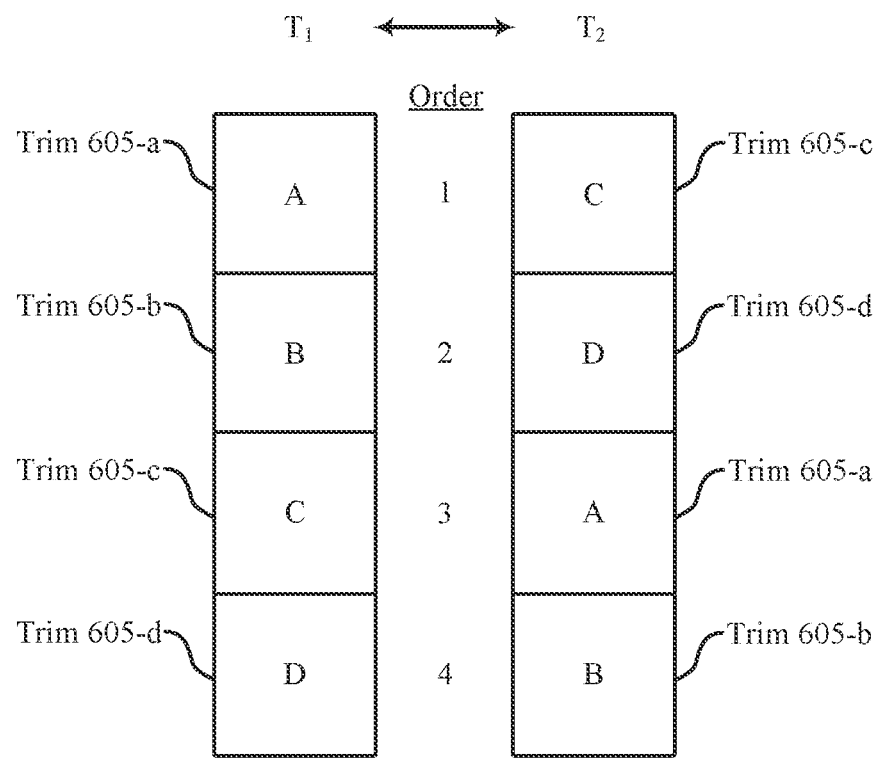
FIG. 6 illustrates an example of a trim diagram that supports techniques for temperature-based access operations in accordance with examples as disclosed herein.

FIG. 6 illustrates an example of a trim diagram 600 that supports techniques for temperature-based access operations in accordance with examples as disclosed herein. The trim diagram 600 may implement or be implemented by aspects of the systems 100, 200, and 500, as described with reference to FIGS. 1, 2, and 5, respectively. For example, aspects of the trim diagram 600 may be implemented by a server or a memory system, which may be an example of the corresponding devices described herein, including with reference to FIGS. 1 through 5. The trim diagram 600 may be implemented to support trim parameter reordering based on memory system temperature, which may support reduced read operation latency, among other benefits. In some examples, the ordering of which reference voltages are used in a read retry operation may be reordered based on the memory system temperature.

A memory system may be configured with multiple trims 605, such as a trim 605-a, a trim 605-b, a trim 605-c, and a trim 605-d (e.g., although the memory system may support being configured with any quantity of trims 605). The trims 605 may be examples of trim parameters described with reference to FIG. 5 for use in performing read operations by the memory system. A server may determine a usage order for the trims 605 based on a current temperature of the memory system by scoring (e.g., calculating scores for) the trims 605, for example, based on priorities associated with data stored at locations of the memory system and a probability that using the trim 605 (e.g., trim parameter) to perform a read operation causes a read error at the locations, as described with reference in FIG. 5.

In the example of FIG. 6, the server may determine that, for a temperature $T_1$ of the memory system, the trim 605-a has a highest score, the trim 605-b has a next highest score, the trim 605-c has a next highest score after the trim 605-b, and the trim 605-d has a lowest score. Accordingly, the server may place trim 605-a as the first trim 605 in the usage order corresponding to the temperature $T_1$, the trim 605-b as the second trim 605, the trim 605-c as the third trim 605, and the trim 605-d as the fourth trim 605. Additionally, the server may determine that, for a temperature $T_2$ of the memory system, the trim 605-c has a highest score, the trim 605-d has a next highest score, the trim 605-a has a next highest score after the trim 605-d, and the trim 605-b has a lowest score. Accordingly, the server may place trim 605-c as the first trim 605 in a usage order corresponding to the temperature $T_2$, the trim 605-d as the second trim 605, the trim 605-a as the third trim 605, and the trim 605-b as the fourth trim 605 It is noted that the server may determine scores and corresponding usage orders for any quantity of temperatures T of the memory system.

The memory system may detect (e.g., at boot time) a current temperature of the memory system and indicate the temperature to the server. Based on the current temperature, the server may indicate the corresponding usage order of the trims 605 to the memory system. For example, the memory system may indicate the temperature $T_2$ to the server, and the server may reorder the trims 605 according to their score at the temperature $T_2$. This may result in a different usage order than the usage order at $T_1$.

The memory system may use the received usage order to determine a trim 605 to use in performing read operations and an order for subsequent trims 605 to attempt to use in case of read failure. This may reduce the probability of a read error occurring at the current memory system temperature and reduce a likelihood that read retry attempts fail, thereby reducing read operation latency.

Figure 7:
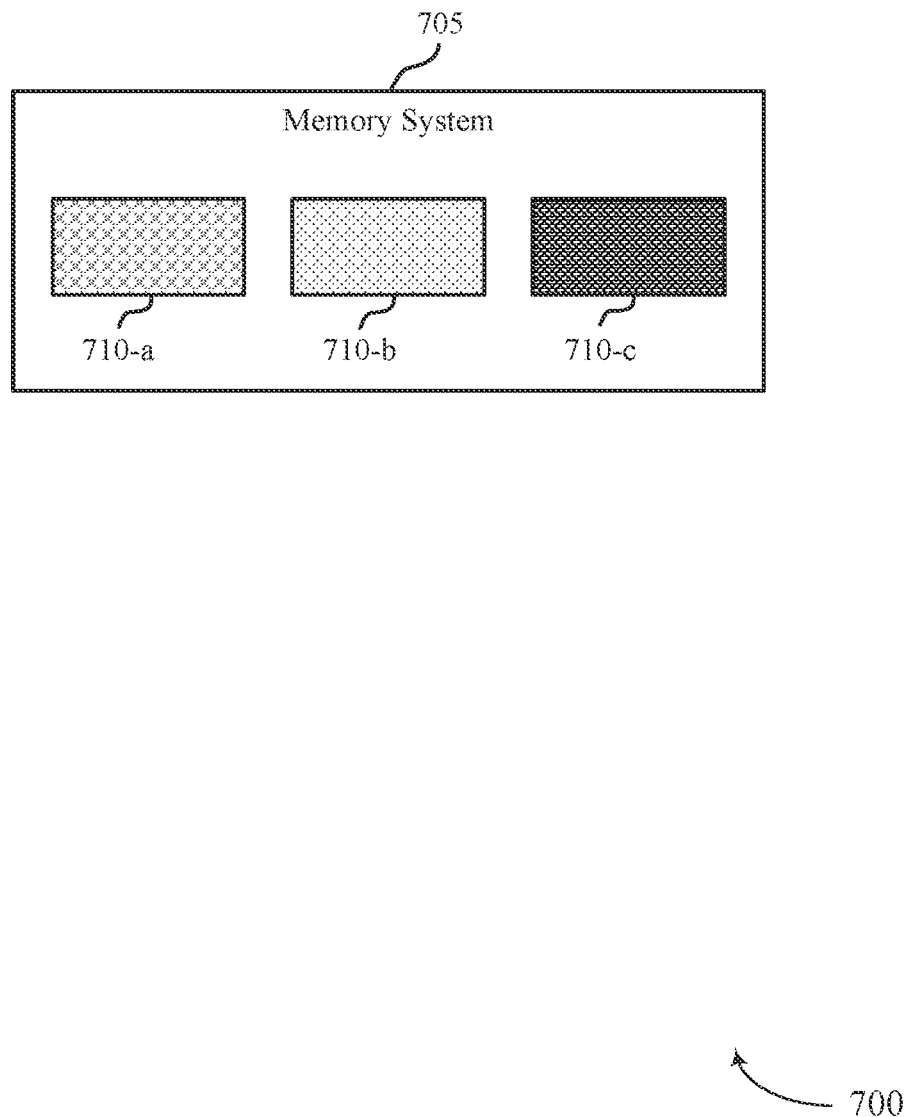
FIG. 7 illustrates an example of a system that supports techniques for temperature-based access operations in accordance with examples as disclosed herein.

FIG. 7 illustrates an example of a system 700 that supports techniques for temperature-based access operations in accordance with examples as disclosed herein. The system 700 may implement or be implemented by aspects of the systems described herein, such as systems 100 and 200 as described with reference to FIGS. 1 and 2, respectively. For example, the system 700 may include a memory system 705, which may be an example of the memory systems described herein, including with reference to FIGS. 1 through 6.

The memory system 705 may be configured (e.g., programmed, operable) to perform refresh operations on locations 710. A refresh operation may involve performing a read operation on a location 710 and re-writing the location 710 with the read data. Refresh operations may be useful to the operation of the memory system 705, as they may maintain the integrity of stored data which may otherwise be gradually lost over time (e.g., due to charge leak). If the memory system 705 performs a refresh while at an extreme temperature, however, the refresh operation may instead compromise the integrity of the data. Performing read and write operations while experiencing extreme operating temperatures may result in higher rates of error relative to performing the read and write operations at non-extreme operating temperatures, so a refresh operation performed at an extreme temperature may incorrectly read the data it is refreshing or incorrectly write the refreshed data, thereby causing errors when the data is read again.

The memory system 705 may send information to a server (e.g., by way of a host system coupled with the memory system) as described with reference to FIG. 2. For example, the memory system may send information relating to read operations and write operations. This may include time, address, size, temperature, and error indication (e.g., an indication of if a read operation failed) information, or a combination thereof. This information may be an example of the write information 225 and the read information 230 as described with reference to FIG. 2. The server may receive the information transmitted by the memory system 705 and, in some cases, receive information relating to read operations and write operations from one or more other memory systems, and use it for processing.

In some examples, the server may determine a range of temperatures within which the memory system 705 is to perform refresh operations based on the information received from the one or more memory systems 705. It may be advantageous to refrain from performing refresh operations when the memory system is operating at some more extreme temperatures (e.g., high temperatures or low temperatures). In some examples, the server may determine a range of temperatures that are associated with a quantity of read errors under a certain threshold. The server may communicate an indication of the determined range of temperatures to the memory system 705 (or a host system coupled with the memory system 705). In some examples, the range of temperatures may be at or near room temperature. In some examples, the range of temperatures may be configured at the memory system 705 separate from the server. That is, the range of temperatures may be a default range of temperatures stored at the memory system 705.

The memory system 705 may perform targeted memory refresh operations on locations 710 that are determined to have been programmed at an extreme temperature if it determines that the current operating temperature is within the range of temperatures to perform memory refresh operations. For example, the memory system 705 may read the temperature information recorded in metadata corresponding to locations 710 to identify locations 710 that were programmed at extreme temperatures. That is, the memory system 705 may write the temperature information to metadata during write operations of data to the locations 710 that may indicate a temperature range of the memory system 705 during the write operation. In the example of FIG. 7, the memory system 705 may identify that a location 710-*a* of the memory system 705 that was programmed (e.g., written) at a temperature that exceeds a first threshold temperature, and perform a refresh operation on the location 710-*a* while the temperature of the memory system 705 is within the range of temperatures. Similarly, the memory system 705 may identify that a location 710-*b* of the memory system 705 was programmed (e.g., written) at a temperature that is below a second threshold temperature, and perform a refresh operation on the location 710-*a* while the temperature of the memory system 705 is within the range of temperatures. The memory system 705 may determine that a location 710-*c* was programmed at a temperature below the first threshold and above the second threshold and refrain from performing a refresh operation on location 710-*c* while the temperature of the memory system 705 is within the range of temperatures. That is, the memory system 705 may determine that the location 710-*c* was programmed at a non-extreme temperature and may thus refrain from performing the refresh operation on the location 710-*c*. The first and second thresholds may be outside the range of temperatures for performing memory refresh operations.

Data stored at locations 710 in the memory system 705 may each be associated with a priority value. The priority values may, in some cases, indicate the importance of data stored in the locations 710. For example, data that is critical for the operation of the memory system 705 (or a system that memory system 705 is part of or otherwise coupled with) may be assigned a higher priority value, while non-critical data may be assigned a lower priority value. The priority values for locations 710 may be stored in a configuration of the memory system 705 or in metadata associated with locations 710.

In some examples, the memory system 705 may perform the targeted memory refresh operations based on the priority values associated with the locations 710. For example, the memory system 705 may read the temperature information corresponding to the locations 710 associated with high priority values (e.g., a priority value above a threshold value). In this case, if the memory system 705 identifies that the current operating temperature is within the range of temperatures for performing refresh operations, the memory system 705 may read the temperature at the write operation for high priority locations 710 and refresh the high priority locations 710 that are determined to have been programmed above a first threshold temperature or below a second threshold temperature. In some cases, the memory system 705 may perform the targeted memory refresh operations during idle conditions (e.g., during garbage collection). This may improve the reliability of data stored in high priority locations 710 of the memory system 705 without incurring additional overhead.

Figure 8:
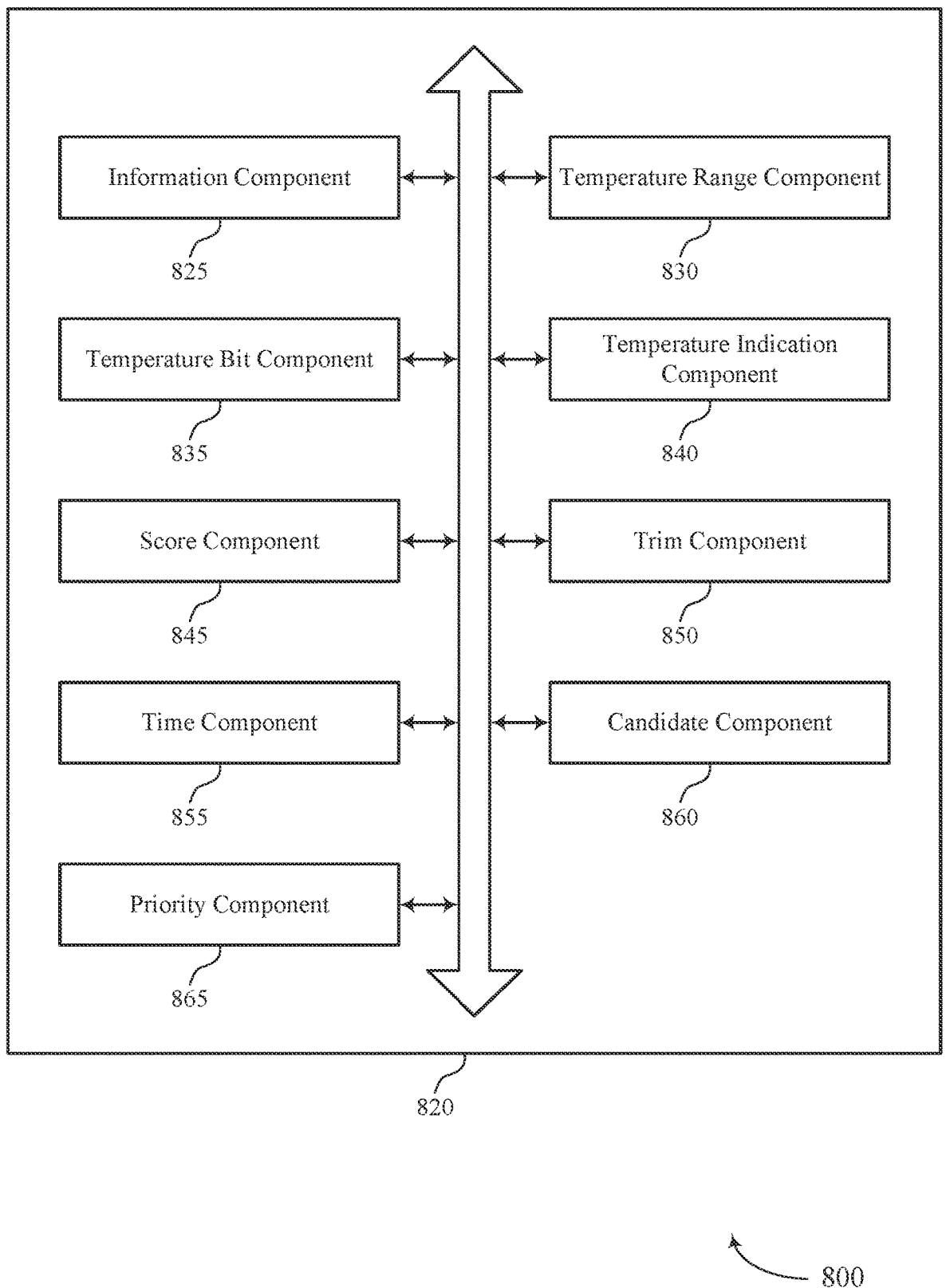
FIG. 8 shows a block diagram of a server that supports techniques for temperature-based access operations in accordance with examples as disclosed herein.

FIG. 8 shows a block diagram 800 of a server 820 that supports techniques for temperature-based access operations in accordance with examples as disclosed herein. The server 820 may be an example of aspects of a server as described with reference to FIGS. 1 through 7. The server 820, or various components thereof, may be an example of means for performing various aspects of techniques for temperature-based access operations as described herein. For example, the server 820 may include an information component 825, a temperature range component 830, a temperature bit component 835, a temperature indication component 840, a score component 845, a trim component 850, a time component 855, a candidate component 860, a priority component 865, or any combination thereof. Each of these components may communicate, directly or indirectly, with one another (e.g., via one or more buses).

The information component 825 may be configured as or otherwise support a means for receiving, from a memory system, first information indicating a first temperature of the memory system for each write operation of a set of write operations and second information indicating a second temperature of the memory system for each read operation of a set of read operations and an indication of whether the read operation failed, the set of read operations corresponding to locations for the set of write operations. The temperature range component 830 may be configured as or otherwise support a means for determining a set of temperature ranges used to indicate the first temperature and the second temperature of the memory system based at least in part on a difference between each first temperature for a write operation at a location and each second temperature for a read operation at the location and the indication of whether the read operation failed. The temperature bit component 835 may be configured as or otherwise support a means for determining a quantity of temperature bits to include in metadata associated with a second set of write operations and a second set of read operations, the quantity of temperature bits including one or more temperature bits indicating a temperature range of the set of temperature ranges and one or more parity bits associated with the one or more temperature bits. The temperature indication component 840 may be configured as or otherwise support a means for transmitting, to the memory system, an indication of the set of temperature ranges and the quantity of temperature bits to include in the metadata.

In some examples, the time component 855 may be configured as or otherwise support a means for determining a difference between each first time for the write operation at the location and each second time for the read operation at the location, where the set of temperature ranges is determined based at least in part on the difference between each first time and each second time.

In some examples, the information component 825 may be configured as or otherwise support a means for categorizing the first information and the second information for different locations of the memory system into groups based on first differences between the first temperature for the write operation and the second temperature for the read operation and second differences between a first time for the write operation and a second time for the read operation. In some examples, the candidate component 860 may be configured as or otherwise support a means for determining a set of candidate temperature ranges for each of the groups based at least in part on a respective quantity of indications that the read operation failed that is associated with each candidate temperature range of the set of candidate temperature ranges for each of the groups. In some examples, the temperature range component 830 may be configured as or otherwise support a means for generating the set of temperature ranges from the set of candidate temperature ranges for each of the groups based at least in part on the respective quantity of indications that the read operation failed.

In some examples, the candidate component 860 may be configured as or otherwise support a means for determining a set of candidate temperature thresholds to separate the set of temperature ranges. In some examples, the temperature range component 830 may be configured as or otherwise support a means for generating a set of temperature thresholds to separate the set of temperature ranges from the set of candidate temperature thresholds based at least in part on a respective quantity of indications that the read operation failed that is associated with each candidate temperature threshold of the set of candidate temperature thresholds.

In some examples, the temperature bit component 835 may be configured as or otherwise support a means for determining a quantity of the one or more temperature bits indicating the temperature range to include in the metadata based at least in part on a quantity of temperature ranges included in the set of temperature ranges.

In some examples, the temperature bit component 835 may be configured as or otherwise support a means for determining a quantity of the one or more parity bits associated with the one or more temperature bits to include in the metadata based at least in part on a total quantity of indications that the read operation failed.

In some examples, the metadata includes the quantity of temperature bits and a quantity of parity bits associated with error correcting data written as part of write operations of the second set of write operations.

In some examples, a failure of the read operation corresponds an uncorrectable error in reading data stored at the location as part of the write operation.

In some examples, the first information includes a first time for each write operation of the set of write operations, a size of data written as part of each write operation of the set of write operations, and a location to which the data is written for each write operation of the set of write operations. In some examples, the second information includes a second time for each read operation, a size of data read as part of each read operation, and a location from which the data is read for each read operation.

In some examples, the temperature range component 830 may be configured as or otherwise support a means for determining a temperature of a memory system during a set of write operations to locations of the memory system. The score component 845 may be configured as or otherwise support a means for determining a score for a trim parameter associated with performing read operations to the locations, where the score is based at least in part on a probability that using the trim parameter to perform the read operations causes the read operations to fail when the memory system is at the temperature. The trim component 850 may be configured as or otherwise support a means for transmitting, to the memory system, an indication of the trim parameter for performing the read operations based at least in part on a current temperature of the memory system and the score for the trim parameter.

In some examples, the priority component 865 may be configured as or otherwise support a means for determining a priority associated with respective data written to the locations during the set of write operations, where the score is based at least in part on the priority associated with the respective data.

In some examples, the score component 845 may be configured as or otherwise support a means for determining a set of scores for a set of trim parameters associated with performing the read operations, the set of trim parameters including the trim parameter, where each score of the set of scores is based at least in part on a respective probability that using a respective trim parameter to perform the read operations causes the read operations to fail when the memory system is at the temperature. In some examples, the trim component 850 may be configured as or otherwise support a means for determining a usage order of the set of trim parameters for performing the read operations based at least in part on the set of scores. In some examples, to support transmitting the indication of the trim parameter, the trim component 850 may be configured as or otherwise support a means for transmitting an indication of the usage order of the set of trim parameters.

In some examples, the current temperature of the memory system corresponds to a temperature of the memory system at a boot time of the memory system.

In some examples, to support determining the temperature of the memory system during the set of write operations, the temperature range component 830 may be configured as or otherwise support a means for reading metadata associated with the set of write operations, the metadata including a quantity of temperature bits that includes one or more temperature bits indicating a temperature range including the temperature of the memory system and one or more parity bits associated with the one or more temperature bits.

Figure 9:
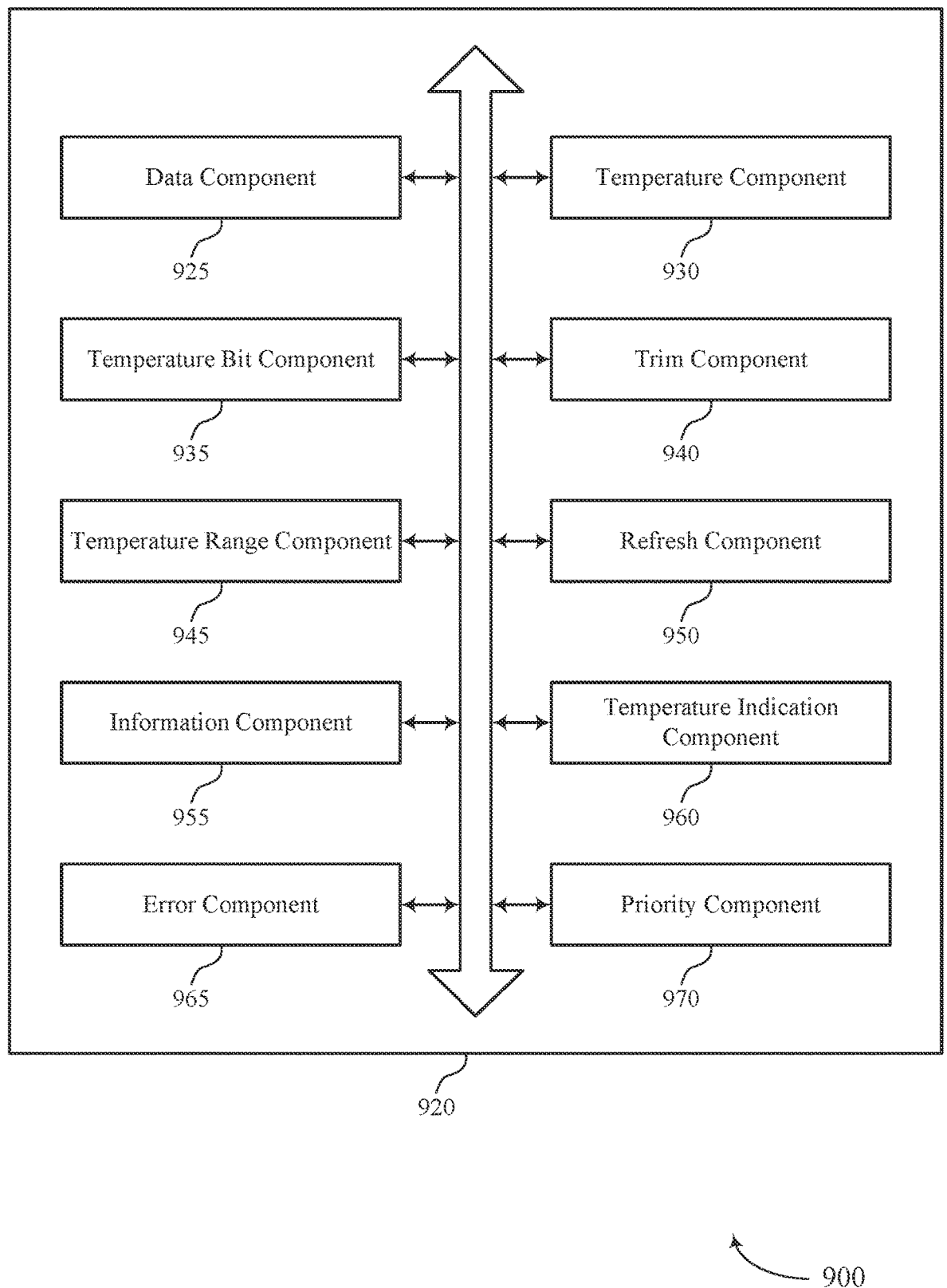
FIG. 9 shows a block diagram of a memory system that supports techniques for temperature-based access operations in accordance with examples as disclosed herein.

FIG. 9 shows a block diagram 900 of a memory system 920 that supports techniques for temperature-based access operations in accordance with examples as disclosed herein. The memory system 920 may be an example of aspects of a memory system as described with reference to FIGS. 1 through 7. The memory system 920, or various components thereof, may be an example of means for performing various aspects of techniques for temperature-based access operations as described herein. For example, the memory system 920 may include a data component 925, a temperature component 930, a temperature bit component 935, a trim component 940, a temperature range component 945, a refresh component 950, an information component 955, a temperature indication component 960, an error component 965, a priority component 970, or any combination thereof. Each of these components may communicate, directly or indirectly, with one another (e.g., via one or more buses).

The data component 925 may be configured as or otherwise support a means for writing, by a memory system, data to a first set of memory cells of the memory system as part of a write operation. The temperature component 930 may be configured as or otherwise support a means for determining a temperature of the memory system during the write operation. The temperature bit component 935 may be configured as or otherwise support a means for writing a quantity of temperature bits to metadata associated with the write operation based at least in part on the temperature of the memory system, the metadata stored at a second set of memory cells, the quantity of temperature bits including one or more temperature bits indicating a temperature range including the temperature and one or more parity bits associated with the one or more temperature bits.

In some examples, the temperature component 930 may be configured as or otherwise support a means for determining a second temperature of the memory system during a read operation of the data written to the first set of memory cells. In some examples, the temperature range component 945 may be configured as or otherwise support a means for reading the metadata to determine the temperature range indicated by the one or more temperature bits. In some examples, the data component 925 may be configured as or otherwise support a means for reading the data written to the first set of memory cells as part of the read operation based at least in part on the temperature range and the second temperature.

In some examples, the trim component 940 may be configured as or otherwise support a means for selecting a trim parameter for reading the data written to the first set of memory cells based at least in part on the temperature range including the temperature of the memory system during the write operation and the second temperature of the memory system during the read operation.

In some examples, the trim component 940 may be configured as or otherwise support a means for selecting a trim parameter for reading the data written to the first set of memory cells based at least in part on the temperature range being different from a second temperature range including the second temperature of the memory system during the read operation.

In some examples, the information component 955 may be configured as or otherwise support a means for transmitting, to a server, first information indicating a first temperature of the memory system for each write operation of a set of write operations and second information indicating a second temperature of the memory system for each read operation of a set of read operations and an indication of whether the read operation failed, the set of read operations corresponding to locations for the set of write operation. In some examples, the temperature indication component 960 may be configured as or otherwise support a means for receiving, from the server and based at least in part on transmitting the first information and the second information, an indication of a set of temperature ranges including the temperature and the quantity of temperature bits to include in the metadata, where writing the quantity of temperature bits to the metadata is based at least in part on receiving the indication.

In some examples, a quantity of the one or more parity bits associated with the one or more temperature bits to include in the metadata is based at least in part on a total quantity of indications that the read operation failed.

In some examples, a failure of the read operation corresponds an uncorrectable error in reading data stored at the location as part of the write operation.

In some examples, the metadata includes the quantity of temperature bits and a quantity of parity bits associated with error correcting data written as part of the write operation.

The trim component 940 may be configured as or otherwise support a means for receiving, at a memory system from a server, an indication of a trim parameter for performing a read operation at the memory system based at least in part on a temperature of the memory system and a probability that using the trim parameter to perform the read operation causes the read operation to fail when the memory system is at the temperature. In some examples, the data component 925 may be configured as or otherwise support a means for performing, at the memory system, the read operation using the trim parameter based at least in part on receiving the indication.

In some examples, to support receiving the indication of the trim parameter, the trim component 940 may be configured as or otherwise support a means for receiving an indication of a usage order of a set of trim parameters for performing the read operation, the set of trim parameters including the trim parameter, where the read operation is performed in accordance with the usage order.

In some examples, the trim parameter is indicated based at least in part on a priority of data read as part of the read operation.

In some examples, the temperature bit component 935 may be configured as or otherwise support a means for transmitting, to the server, metadata associated with a write operation to a location of the memory system corresponding to the read operation, the metadata including a quantity of temperature bits that includes one or more temperature bits indicating a temperature range including a previous temperature of the memory system during the write operation and one or more parity bits associated with the one or more temperature bits, where receiving the indication of the trim parameter is based at least in part on the metadata.

In some examples, to support performing the read operation, the data component 925 may be configured as or otherwise support a means for reading data stored at a location indicated by the read operation using a first reference voltage associated with the trim parameter. In some examples, to support performing the read operation, the error component 965 may be configured as or otherwise support a means for determining one or more errors associated with the data read using the first reference voltage. In some examples, to support performing the read operation, the data component 925 may be configured as or otherwise support a means for read the data using a second reference voltage associated with a second trim parameter based at least in part on determining the one or more errors, the second trim parameter selected based at least in part on a second probability that using the second trim parameter to perform the read operation causes the read operation to fail when the memory system is at the temperature, where the second probability is greater than the probability.

The temperature range component 945 may be configured as or otherwise support a means for determining that a temperature of a memory system is within a first range of temperatures. In some examples, the data component 925 may be configured as or otherwise support a means for determining a location of the memory system that stores data written at a time during which a previous temperature of the memory system failed to satisfy a threshold temperature, the threshold temperature outside of the first range of temperatures. The refresh component 950 may be configured as or otherwise support a means for performing a refresh operation on the location while the temperature of the memory system is within the first range of temperatures based at least in part on the data being written while the previous temperature failed to satisfy the threshold temperature.

In some examples, the priority component 970 may be configured as or otherwise support a means for determining that a priority associated with the data satisfies a threshold priority, where the refresh operation is performed based at least in part on the priority satisfying the threshold priority.

In some examples, the temperature component 930 may be configured as or otherwise support a means for determining the previous temperature of the memory system based at least in part on a quantity of temperature bits included in metadata associated with the data, the quantity of temperature bits including one or more temperature bits indicating a temperature range including the previous temperature of the memory system and one or more parity bits associated with the one or more temperature bits, where the temperature range is outside of a threshold temperature range.

In some examples, the previous temperature failing to satisfy the threshold temperature includes the previous temperature being greater than the threshold temperature.

In some examples, the previous temperature failing to satisfy the threshold temperature includes the previous temperature being less than the threshold temperature.

Figure 10:
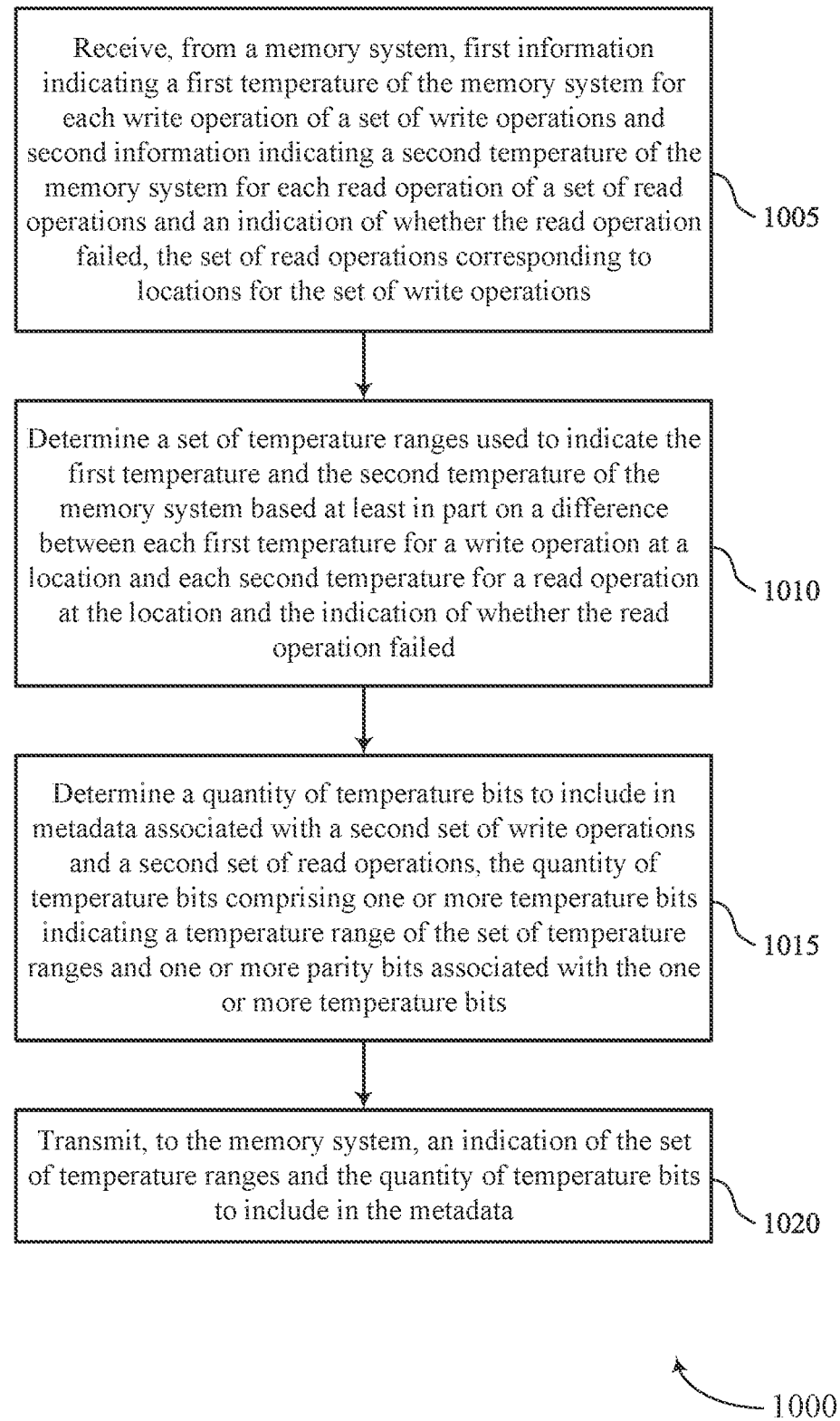
FIGS. 10 through 14 show flowcharts illustrating a method or methods that support techniques for temperature-based access operations in accordance with examples as disclosed herein.

FIG. 10 shows a flowchart illustrating a method 1000 that supports techniques for temperature-based access operations in accordance with examples as disclosed herein. The operations of method 1000 may be implemented by a server or its components as described herein. For example, the operations of method 1000 may be performed by a server as described with reference to FIGS. 1 through 8. In some examples, a server may execute a set of instructions to control the functional elements of the device to perform the described functions. Additionally, or alternatively, the server may perform aspects of the described functions using special-purpose hardware.

At 1005, the method may include receiving, from a memory system, first information indicating a first temperature of the memory system for each write operation of a set of write operations and second information indicating a second temperature of the memory system for each read operation of a set of read operations and an indication of whether the read operation failed, the set of read operations corresponding to locations for the set of write operations. The operations of 1005 may be performed in accordance with examples as disclosed herein. In some examples, aspects of the operations of 1005 may be performed by an information component 825 as described with reference to FIG. 8.

At 1010, the method may include determining a set of temperature ranges used to indicate the first temperature and the second temperature of the memory system based at least in part on a difference between each first temperature for a write operation at a location and each second temperature for a read operation at the location and the indication of whether the read operation failed. The operations of 1010 may be performed in accordance with examples as disclosed herein. In some examples, aspects of the operations of 1010 may be performed by a temperature range component 830 as described with reference to FIG. 8.

At 1015, the method may include determining a quantity of temperature bits to include in metadata associated with a second set of write operations and a second set of read operations, the quantity of temperature bits including one or more temperature bits indicating a temperature range of the set of temperature ranges and one or more parity bits associated with the one or more temperature bits. The operations of 1015 may be performed in accordance with examples as disclosed herein. In some examples, aspects of the operations of 1015 may be performed by a temperature bit component 835 as described with reference to FIG. 8.

At 1020, the method may include transmitting, to the memory system, an indication of the set of temperature ranges and the quantity of temperature bits to include in the metadata. The operations of 1020 may be performed in accordance with examples as disclosed herein. In some examples, aspects of the operations of 1020 may be performed by a temperature indication component 840 as described with reference to FIG. 8.

In some examples, an apparatus as described herein may perform a method or methods, such as the method 1000. The apparatus may include features, circuitry, logic, means, or instructions (e.g., a non-transitory computer-readable medium storing instructions executable by a processor), or any combination thereof for performing the following aspects of the present disclosure:

Aspect 1: A method, apparatus, or non-transitory computer-readable medium including operations, features, circuitry, logic, means, or instructions, or any combination thereof for receiving, from a memory system, first information indicating a first temperature of the memory system for each write operation of a set of write operations and second information indicating a second temperature of the memory system for each read operation of a set of read operations and an indication of whether the read operation failed, the set of read operations corresponding to locations for the set of write operations; determining a set of temperature ranges used to indicate the first temperature and the second temperature of the memory system based at least in part on a difference between each first temperature for a write operation at a location and each second temperature for a read operation at the location and the indication of whether the read operation failed; determining a quantity of temperature bits to include in metadata associated with a second set of write operations and a second set of read operations, the quantity of temperature bits including one or more temperature bits indicating a temperature range of the set of temperature ranges and one or more parity bits associated with the one or more temperature bits; and transmitting, to the memory system, an indication of the set of temperature ranges and the quantity of temperature bits to include in the metadata.

Aspect 2: The method, apparatus, or non-transitory computer-readable medium of aspect 1, further including operations, features, circuitry, logic, means, or instructions, or any combination thereof for determining a difference between each first time for the write operation at the location and each second time for the read operation at the location, where the set of temperature ranges is determined based at least in part on the difference between each first time and each second time.

Aspect 3: The method, apparatus, or non-transitory computer-readable medium of any of aspects 1 through 2, further including operations, features, circuitry, logic, means, or instructions, or any combination thereof for categorizing the first information and the second information for different locations of the memory system into groups based on first differences between the first temperature for the write operation and the second temperature for the read operation and second differences between a first time for the write operation and a second time for the read operation; determining a set of candidate temperature ranges for each of the groups based at least in part on a respective quantity of indications that the read operation failed that is associated with each candidate temperature range of the set of candidate temperature ranges for each of the groups; and generating the set of temperature ranges from the set of candidate temperature ranges for each of the groups based at least in part on the respective quantity of indications that the read operation failed.

Aspect 4: The method, apparatus, or non-transitory computer-readable medium of any of aspects 1 through 3, further including operations, features, circuitry, logic, means, or instructions, or any combination thereof for determining a set of candidate temperature thresholds to separate the set of temperature ranges and generating a set of temperature thresholds to separate the set of temperature ranges from the set of candidate temperature thresholds based at least in part on a respective quantity of indications that the read operation failed that is associated with each candidate temperature threshold of the set of candidate temperature thresholds.

Aspect 5: The method, apparatus, or non-transitory computer-readable medium of any of aspects 1 through 4, further including operations, features, circuitry, logic, means, or instructions, or any combination thereof for determining a quantity of the one or more temperature bits indicating the temperature range to include in the metadata based at least in part on a quantity of temperature ranges included in the set of temperature ranges.

Aspect 6: The method, apparatus, or non-transitory computer-readable medium of any of aspects 1 through 5, further including operations, features, circuitry, logic, means, or instructions, or any combination thereof for determining a quantity of the one or more parity bits associated with the one or more temperature bits to include in the metadata based at least in part on a total quantity of indications that the read operation failed.

Aspect 7: The method, apparatus, or non-transitory computer-readable medium of any of aspects 1 through 6 where the metadata includes the quantity of temperature bits and a quantity of parity bits associated with error correcting data written as part of write operations of the second set of write operations.

Aspect 8: The method, apparatus, or non-transitory computer-readable medium of any of aspects 1 through 7 where a failure of the read operation corresponds an uncorrectable error in reading data stored at the location as part of the write operation.

Aspect 9: The method, apparatus, or non-transitory computer-readable medium of any of aspects 1 through 8 where the first information includes a first time for each write operation of the set of write operations, a size of data written as part of each write operation of the set of write operations, and a location to which the data is written for each write operation of the set of write operations and the second information includes a second time for each read operation, a size of data read as part of each read operation, and a location from which the data is read for each read operation.

Figure 11:
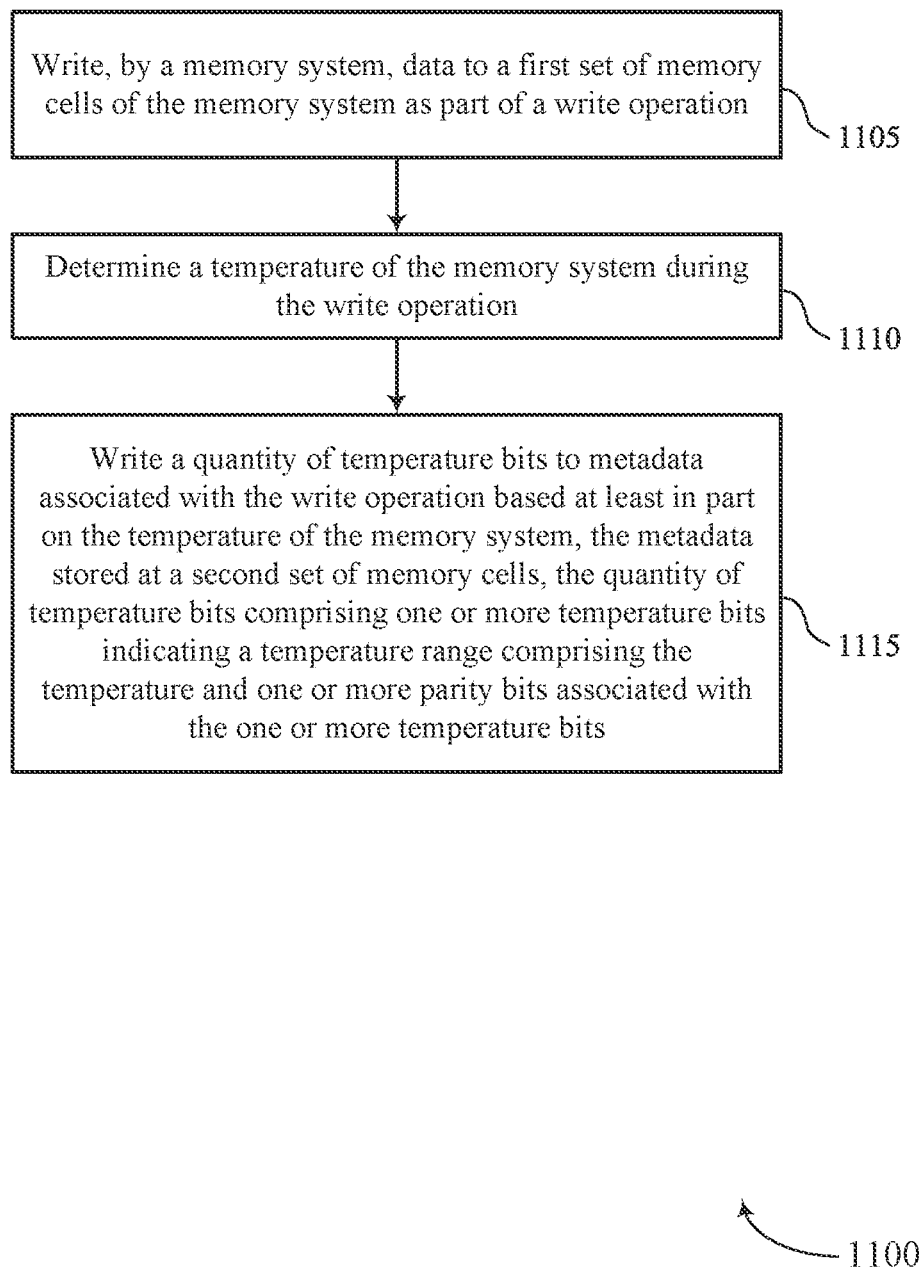

FIG. 11 shows a flowchart illustrating a method 1100 that supports techniques for temperature-based access operations in accordance with examples as disclosed herein. The operations of method 1100 may be implemented by a memory system or its components as described herein. For example, the operations of method 1100 may be performed by a memory system as described with reference to FIGS. 1 through 7 and 9. In some examples, a memory system may execute a set of instructions to control the functional elements of the device to perform the described functions. Additionally, or alternatively, the memory system may perform aspects of the described functions using special-purpose hardware.

At 1105, the method may include writing, by a memory system, data to a first set of memory cells of the memory system as part of a write operation. The operations of 1105 may be performed in accordance with examples as disclosed herein. In some examples, aspects of the operations of 1105 may be performed by a data component 925 as described with reference to FIG. 9.

At 1110, the method may include determining a temperature of the memory system during the write operation. The operations of 1110 may be performed in accordance with examples as disclosed herein. In some examples, aspects of the operations of 1110 may be performed by a temperature component 930 as described with reference to FIG. 9.

At 1115, the method may include writing a quantity of temperature bits to metadata associated with the write operation based at least in part on the temperature of the memory system, the metadata stored at a second set of memory cells, the quantity of temperature bits including one or more temperature bits indicating a temperature range including the temperature and one or more parity bits associated with the one or more temperature bits. The operations of 1115 may be performed in accordance with examples as disclosed herein. In some examples, aspects of the operations of 1115 may be performed by a temperature bit component 935 as described with reference to FIG. 9.

In some examples, an apparatus as described herein may perform a method or methods, such as the method 1100. The apparatus may include features, circuitry, logic, means, or instructions (e.g., a non-transitory computer-readable medium storing instructions executable by a processor), or any combination thereof for performing the following aspects of the present disclosure:

Aspect 10: A method, apparatus, or non-transitory computer-readable medium including operations, features, circuitry, logic, means, or instructions, or any combination thereof for writing, by a memory system, data to a first set of memory cells of the memory system as part of a write operation; determining a temperature of the memory system during the write operation; and writing a quantity of temperature bits to metadata associated with the write operation based at least in part on the temperature of the memory system, the metadata stored at a second set of memory cells, the quantity of temperature bits including one or more temperature bits indicating a temperature range including the temperature and one or more parity bits associated with the one or more temperature bits.

Aspect 11: The method, apparatus, or non-transitory computer-readable medium of aspect 10, further including operations, features, circuitry, logic, means, or instructions, or any combination thereof for determining a second temperature of the memory system during a read operation of the data written to the first set of memory cells; reading the metadata to determine the temperature range indicated by the one or more temperature bits; and reading the data written to the first set of memory cells as part of the read operation based at least in part on the temperature range and the second temperature.

Aspect 12: The method, apparatus, or non-transitory computer-readable medium of aspect 11, further including operations, features, circuitry, logic, means, or instructions, or any combination thereof for selecting a trim parameter for reading the data written to the first set of memory cells based at least in part on the temperature range including the temperature of the memory system during the write operation and the second temperature of the memory system during the read operation.

Aspect 13: The method, apparatus, or non-transitory computer-readable medium of aspect 11, further including operations, features, circuitry, logic, means, or instructions, or any combination thereof for selecting a trim parameter for reading the data written to the first set of memory cells based at least in part on the temperature range being different from a second temperature range including the second temperature of the memory system during the read operation.

Aspect 14: The method, apparatus, or non-transitory computer-readable medium of any of aspects 10 through 13, further including operations, features, circuitry, logic, means, or instructions, or any combination thereof for transmitting, to a server, first information indicating a first temperature of the memory system for each write operation of a set of write operations and second information indicating a second temperature of the memory system for each read operation of a set of read operations and an indication of whether the read operation failed, the set of read operations corresponding to locations for the set of write operation and receiving, from the server and based at least in part on transmitting the first information and the second information, an indication of a set of temperature ranges including the temperature and the quantity of temperature bits to include in the metadata, where writing the quantity of temperature bits to the metadata is based at least in part on receiving the indication.

Aspect 15: The method, apparatus, or non-transitory computer-readable medium of aspect 14 where a quantity of the one or more parity bits associated with the one or more temperature bits to include in the metadata is based at least in part on a total quantity of indications that the read operation failed.

Aspect 16: The method, apparatus, or non-transitory computer-readable medium of any of aspects 14 through 15 where a failure of the read operation corresponds an uncorrectable error in reading data stored at the location as part of the write operation.

Aspect 17: The method, apparatus, or non-transitory computer-readable medium of any of aspects 10 through 16 where the metadata includes the quantity of temperature bits and a quantity of parity bits associated with error correcting data written as part of the write operation.

Figure 12:
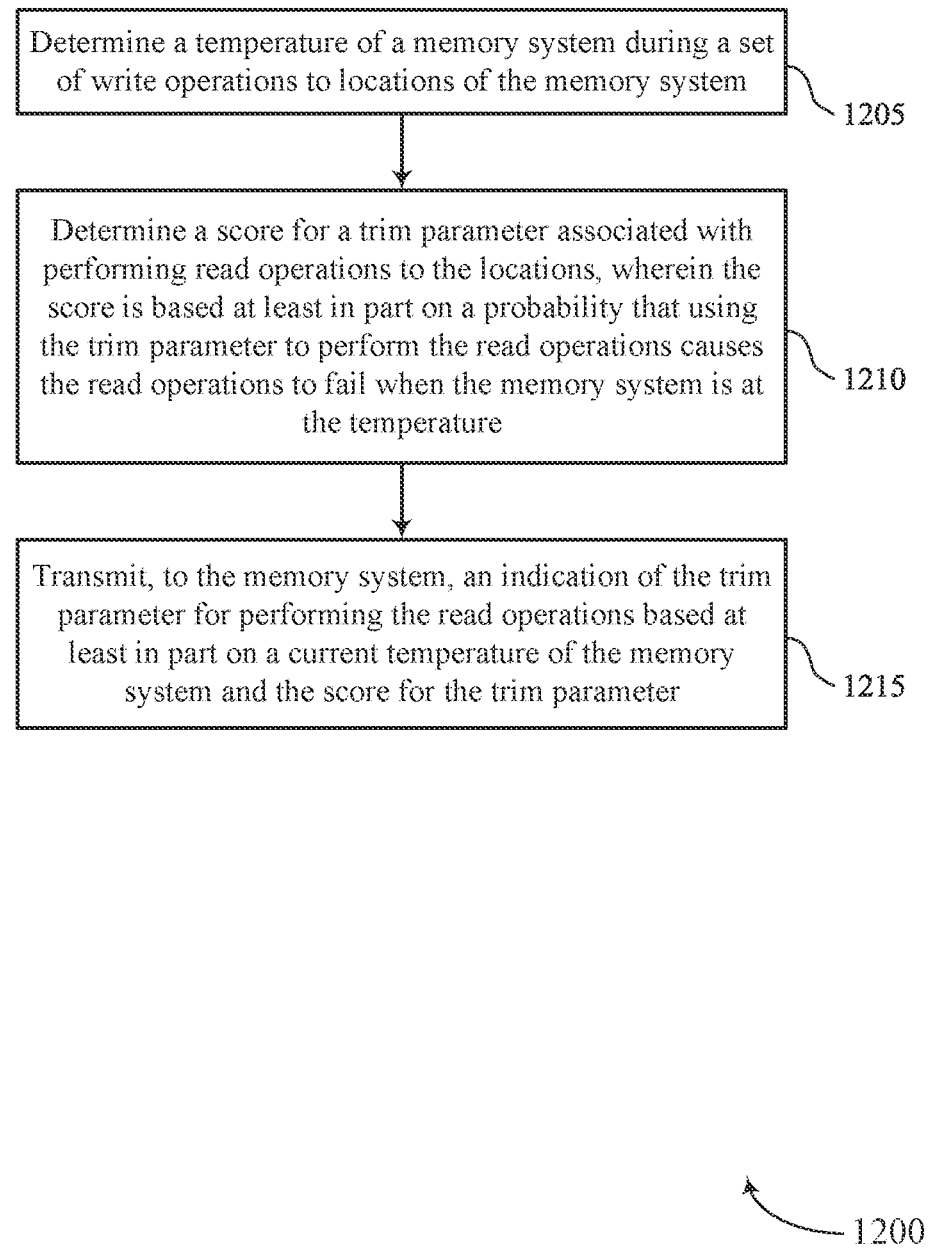

FIG. 12 shows a flowchart illustrating a method 1200 that supports techniques for temperature-based access operations in accordance with examples as disclosed herein. The operations of method 1200 may be implemented by a server or its components as described herein. For example, the operations of method 1200 may be performed by a server as described with reference to FIGS. 1 through 8. In some examples, a server may execute a set of instructions to control the functional elements of the device to perform the described functions. Additionally, or alternatively, the server may perform aspects of the described functions using special-purpose hardware.

At 1205, the method may include determining a temperature of a memory system during a set of write operations to locations of the memory system. The operations of 1205 may be performed in accordance with examples as disclosed herein. In some examples, aspects of the operations of 1205 may be performed by a temperature range component 830 as described with reference to FIG. 8.

At 1210, the method may include determining a score for a trim parameter associated with performing read operations to the locations, where the score is based at least in part on a probability that using the trim parameter to perform the read operations causes the read operations to fail when the memory system is at the temperature. The operations of 1210 may be performed in accordance with examples as disclosed herein. In some examples, aspects of the operations of 1210 may be performed by a score component 845 as described with reference to FIG. 8.

At 1215, the method may include transmitting, to the memory system, an indication of the trim parameter for performing the read operations based at least in part on a current temperature of the memory system and the score for the trim parameter. The operations of 1215 may be performed in accordance with examples as disclosed herein. In some examples, aspects of the operations of 1215 may be performed by a trim component 850 as described with reference to FIG. 8.

In some examples, an apparatus as described herein may perform a method or methods, such as the method 1200. The apparatus may include features, circuitry, logic, means, or instructions (e.g., a non-transitory computer-readable medium storing instructions executable by a processor), or any combination thereof for performing the following aspects of the present disclosure:

Aspect 18: A method, apparatus, or non-transitory computer-readable medium including operations, features, circuitry, logic, means, or instructions, or any combination thereof for determining a temperature of a memory system during a set of write operations to locations of the memory system; determining a score for a trim parameter associated with performing read operations to the locations, where the score is based at least in part on a probability that using the trim parameter to perform the read operations causes the read operations to fail when the memory system is at the temperature; and transmitting, to the memory system, an indication of the trim parameter for performing the read operations based at least in part on a current temperature of the memory system and the score for the trim parameter.

Aspect 19: The method, apparatus, or non-transitory computer-readable medium of aspect 18, further including operations, features, circuitry, logic, means, or instructions, or any combination thereof for determining a priority associated with respective data written to the locations during the set of write operations, where the score is based at least in part on the priority associated with the respective data.

Aspect 20: The method, apparatus, or non-transitory computer-readable medium of any of aspects 18 through 19, further including operations, features, circuitry, logic, means, or instructions, or any combination thereof for determining a set of scores for a set of trim parameters associated with performing the read operations, the set of trim parameters including the trim parameter, where each score of the set of scores is based at least in part on a respective probability that using a respective trim parameter to perform the read operations causes the read operations to fail when the memory system is at the temperature; and determining a usage order of the set of trim parameters for performing the read operations based at least in part on the set of scores, where transmitting the indication of the trim parameter includes operations, features, circuitry, logic, means, or instructions, or any combination thereof for: transmitting an indication of the usage order of the set of trim parameters.

Aspect 21: The method, apparatus, or non-transitory computer-readable medium of any of aspects 18 through 20 where the current temperature of the memory system corresponds to a temperature of the memory system at a boot time of the memory system.

Aspect 22: The method, apparatus, or non-transitory computer-readable medium of any of aspects 18 through 21 where determining the temperature of the memory system during the set of write operations includes operations, features, circuitry, logic, means, or instructions, or any combination thereof for reading metadata associated with the set of write operations, the metadata including a quantity of temperature bits that includes one or more temperature bits indicating a temperature range including the temperature of the memory system and one or more parity bits associated with the one or more temperature bits.

Figure 13:
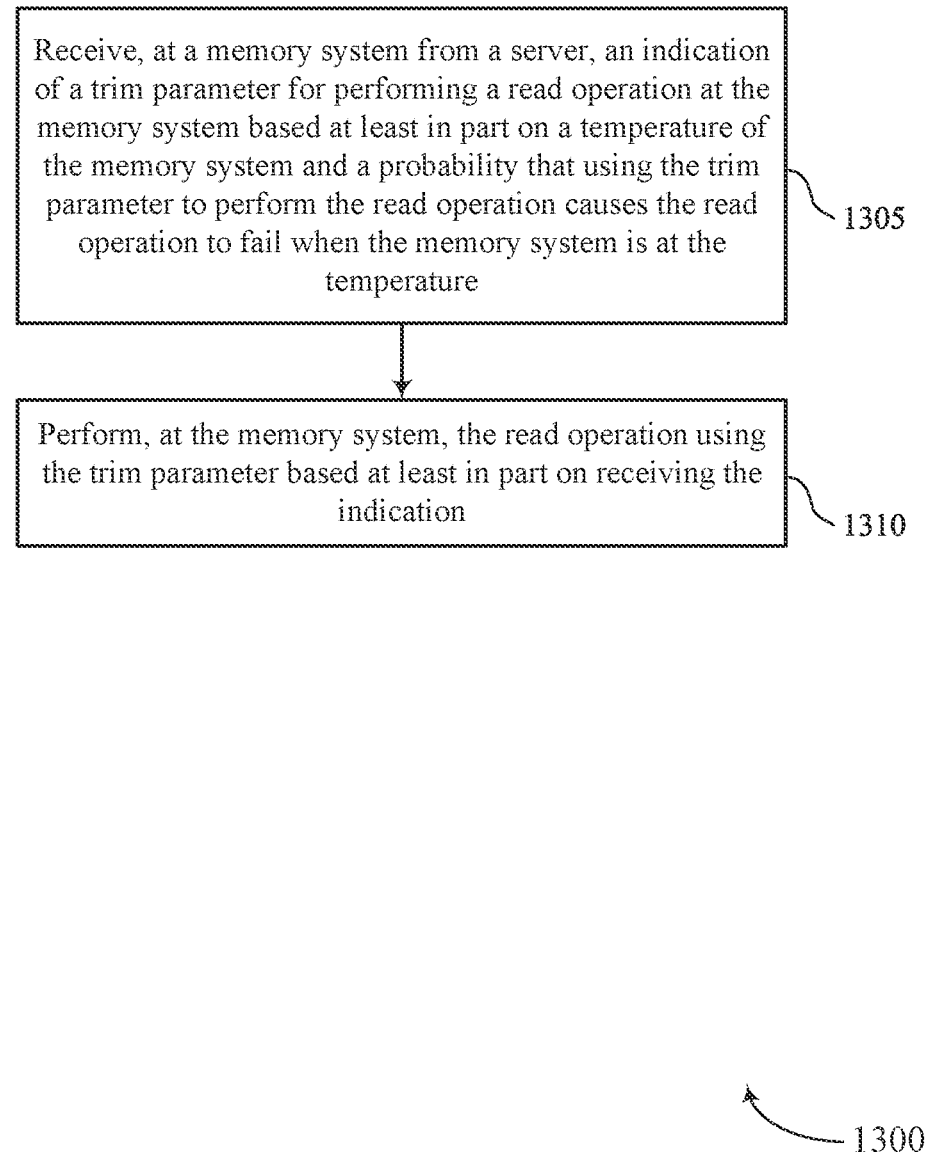

FIG. 13 shows a flowchart illustrating a method 1300 that supports techniques for temperature-based access operations in accordance with examples as disclosed herein. The operations of method 1300 may be implemented by a memory system or its components as described herein. For example, the operations of method 1300 may be performed by a memory system as described with reference to FIGS. 1 through 7 and 9. In some examples, a memory system may execute a set of instructions to control the functional elements of the device to perform the described functions. Additionally, or alternatively, the memory system may perform aspects of the described functions using special-purpose hardware.

At 1305, the method may include receiving, at a memory system from a server, an indication of a trim parameter for performing a read operation at the memory system based at least in part on a temperature of the memory system and a probability that using the trim parameter to perform the read operation causes the read operation to fail when the memory system is at the temperature. The operations of 1305 may be performed in accordance with examples as disclosed herein. In some examples, aspects of the operations of 1305 may be performed by a trim component 940 as described with reference to FIG. 9.

At 1310, the method may include performing, at the memory system, the read operation using the trim parameter based at least in part on receiving the indication. The operations of 1310 may be performed in accordance with examples as disclosed herein. In some examples, aspects of the operations of 1310 may be performed by a data component 925 as described with reference to FIG. 9.

In some examples, an apparatus as described herein may perform a method or methods, such as the method 1300. The apparatus may include features, circuitry, logic, means, or instructions (e.g., a non-transitory computer-readable medium storing instructions executable by a processor), or any combination thereof for performing the following aspects of the present disclosure:

Aspect 23: A method, apparatus, or non-transitory computer-readable medium including operations, features, circuitry, logic, means, or instructions, or any combination thereof for receiving, at a memory system from a server, an indication of a trim parameter for performing a read operation at the memory system based at least in part on a temperature of the memory system and a probability that using the trim parameter to perform the read operation causes the read operation to fail when the memory system is at the temperature and performing, at the memory system, the read operation using the trim parameter based at least in part on receiving the indication.

Aspect 24: The method, apparatus, or non-transitory computer-readable medium of aspect 23 where receiving the indication of the trim parameter includes operations, features, circuitry, logic, means, or instructions, or any combination thereof for receiving an indication of a usage order of a set of trim parameters for performing the read operation, the set of trim parameters including the trim parameter, where the read operation is performed in accordance with the usage order.

Aspect 25: The method, apparatus, or non-transitory computer-readable medium of any of aspects 23 through 24 where the trim parameter is indicated based at least in part on a priority of data read as part of the read operation.

Aspect 26: The method, apparatus, or non-transitory computer-readable medium of any of aspects 23 through 25, further including operations, features, circuitry, logic, means, or instructions, or any combination thereof for transmitting, to the server, metadata associated with a write operation to a location of the memory system corresponding to the read operation, the metadata including a quantity of temperature bits that includes one or more temperature bits indicating a temperature range including a previous temperature of the memory system during the write operation and one or more parity bits associated with the one or more temperature bits, where receiving the indication of the trim parameter is based at least in part on the metadata.

Aspect 27: The method, apparatus, or non-transitory computer-readable medium of any of aspects 23 through 26 where performing the read operation includes operations, features, circuitry, logic, means, or instructions, or any combination thereof for reading data stored at a location indicated by the read operation using a first reference voltage associated with the trim parameter; determining one or more errors associated with the data read using the first reference voltage; and read the data using a second reference voltage associated with a second trim parameter based at least in part on determining the one or more errors, the second trim parameter selected based at least in part on a second probability that using the second trim parameter to perform the read operation causes the read operation to fail when the memory system is at the temperature, where the second probability is greater than the probability.

Figure 14:
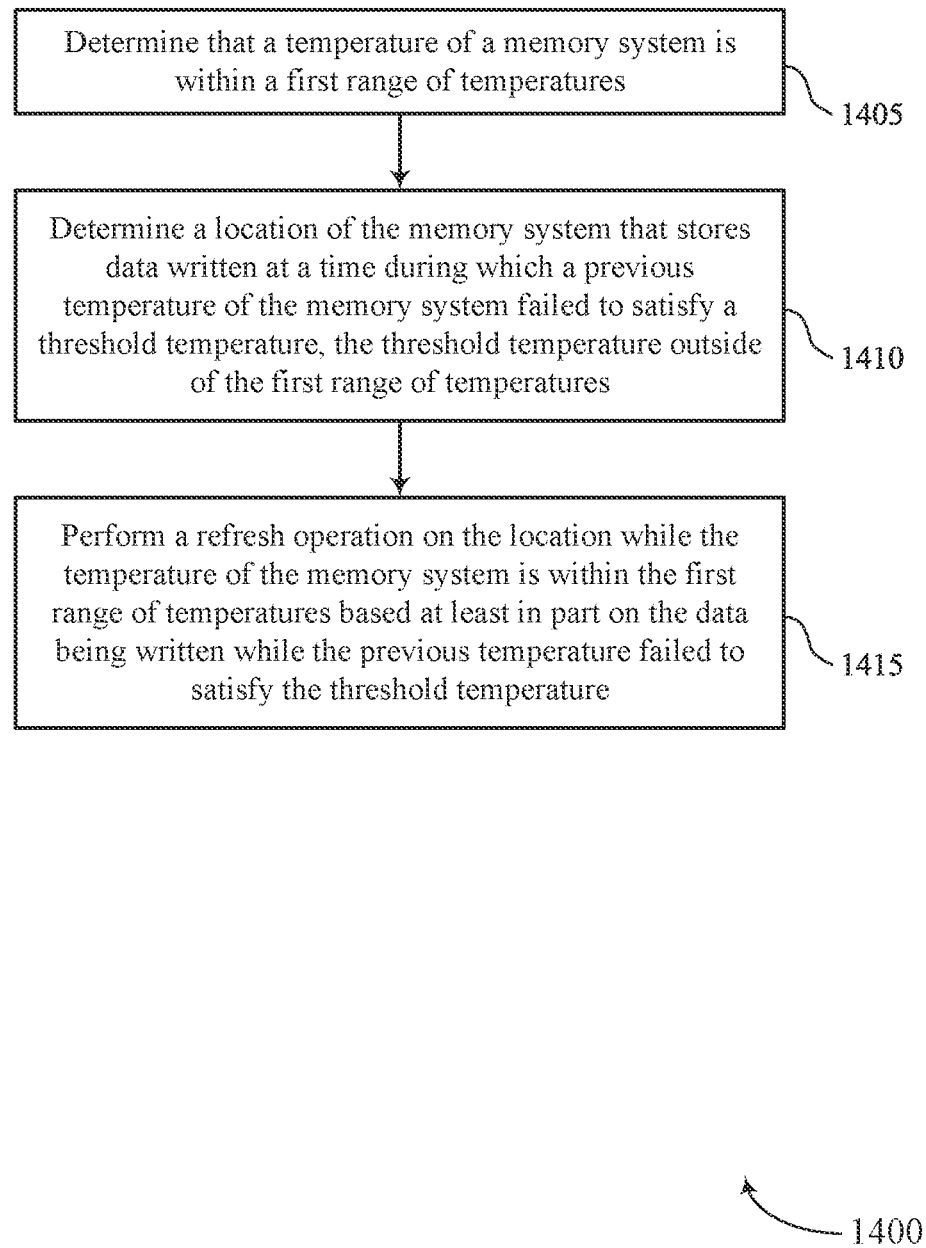

FIG. 14 shows a flowchart illustrating a method 1400 that supports techniques for temperature-based access operations in accordance with examples as disclosed herein. The operations of method 1400 may be implemented by a memory system or its components as described herein. For example, the operations of method 1400 may be performed by a memory system as described with reference to FIGS. 1 through 7 and 9. In some examples, a memory system may execute a set of instructions to control the functional elements of the device to perform the described functions. Additionally, or alternatively, the memory system may perform aspects of the described functions using special-purpose hardware.

At 1405, the method may include determining that a temperature of a memory system is within a first range of temperatures. The operations of 1405 may be performed in accordance with examples as disclosed herein. In some examples, aspects of the operations of 1405 may be performed by a temperature range component 945 as described with reference to FIG. 9.

At 1410, the method may include determining a location of the memory system that stores data written at a time during which a previous temperature of the memory system failed to satisfy a threshold temperature, the threshold temperature outside of the first range of temperatures. The operations of 1410 may be performed in accordance with examples as disclosed herein. In some examples, aspects of the operations of 1410 may be performed by a data component 925 as described with reference to FIG. 9.

At 1415, the method may include performing a refresh operation on the location while the temperature of the memory system is within the first range of temperatures based at least in part on the data being written while the previous temperature failed to satisfy the threshold temperature. The operations of 1415 may be performed in accordance with examples as disclosed herein. In some examples, aspects of the operations of 1415 may be performed by a refresh component 950 as described with reference to FIG. 9.

In some examples, an apparatus as described herein may perform a method or methods, such as the method 1400. The apparatus may include features, circuitry, logic, means, or instructions (e.g., a non-transitory computer-readable medium storing instructions executable by a processor), or any combination thereof for performing the following aspects of the present disclosure:

Aspect 28: A method, apparatus, or non-transitory computer-readable medium including operations, features, circuitry, logic, means, or instructions, or any combination thereof for determining that a temperature of a memory system is within a first range of temperatures; determining a location of the memory system that stores data written at a time during which a previous temperature of the memory system failed to satisfy a threshold temperature, the threshold temperature outside of the first range of temperatures; and performing a refresh operation on the location while the temperature of the memory system is within the first range of temperatures based at least in part on the data being written while the previous temperature failed to satisfy the threshold temperature.

Aspect 29: The method, apparatus, or non-transitory computer-readable medium of aspect 28, further including operations, features, circuitry, logic, means, or instructions, or any combination thereof for determining that a priority associated with the data satisfies a threshold priority, where the refresh operation is performed based at least in part on the priority satisfying the threshold priority.

Aspect 30: The method, apparatus, or non-transitory computer-readable medium of any of aspects 28 through 29, further including operations, features, circuitry, logic, means, or instructions, or any combination thereof for determining the previous temperature of the memory system based at least in part on a quantity of temperature bits included in metadata associated with the data, the quantity of temperature bits including one or more temperature bits indicating a temperature range including the previous temperature of the memory system and one or more parity bits associated with the one or more temperature bits, where the temperature range is outside of a threshold temperature range.

Aspect 31: The method, apparatus, or non-transitory computer-readable medium of any of aspects 28 through 30 where the previous temperature failing to satisfy the threshold temperature includes the previous temperature being greater than the threshold temperature.

Aspect 32: The method, apparatus, or non-transitory computer-readable medium of any of aspects 28 through 31 where the previous temperature failing to satisfy the threshold temperature includes the previous temperature being less than the threshold temperature.

It should be noted that the methods described above describe possible implementations, and that the operations and the steps may be rearranged or otherwise modified and that other implementations are possible. Further, portions from two or more of the methods may be combined.

Information and signals described herein may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof. Some drawings may illustrate signals as a single signal; however, the signal may represent a bus of signals, where the bus may have a variety of bit widths.

The terms "electronic communication," "conductive contact," "connected," and "coupled" may refer to a relationship between components that supports the flow of signals between the components. Components are considered in electronic communication with (or in conductive contact with or connected with or coupled with) one another if there is any conductive path between the components that can, at any time, support the flow of signals between the components. At any given time, the conductive path between components that are in electronic communication with each other (or in conductive contact with or connected with or coupled with) may be an open circuit or a closed circuit based on the operation of the device that includes the connected components. The conductive path between connected components may be a direct conductive path between the components or the conductive path between connected components may be an indirect conductive path that may include intermediate components, such as switches, transistors, or other components. In some examples, the flow of signals between the connected components may be interrupted for a time, for example, using one or more intermediate components such as switches or transistors.

The term "coupling" refers to a condition of moving from an open-circuit relationship between components in which signals are not presently capable of being communicated between the components over a conductive path to a closed-circuit relationship between components in which signals are capable of being communicated between components over the conductive path. If a component, such as a controller, couples other components together, the component initiates a change that allows signals to flow between the other components over a conductive path that previously did not permit signals to flow.

The term "isolated" refers to a relationship between components in which signals are not presently capable of flowing between the components. Components are isolated from each other if there is an open circuit between them. For example, two components separated by a switch that is positioned between the components are isolated from each other if the switch is open. If a controller isolates two components, the controller affects a change that prevents signals from flowing between the components using a conductive path that previously permitted signals to flow.

The terms "if," "when," "based on," or "based at least in part on" may be used interchangeably. In some examples, if the terms "if," "when," "based on," or "based at least in part on" are used to describe a conditional action, a conditional process, or connection between portions of a process, the terms may be interchangeable.

The term "in response to" may refer to one condition or action occurring at least partially, if not fully, as a result of a previous condition or action. For example, a first condition or action may be performed and second condition or action may at least partially occur as a result of the previous condition or action occurring (whether directly after or after one or more other intermediate conditions or actions occurring after the first condition or action).

Additionally, the terms "directly in response to" or "in direct response to" may refer to one condition or action occurring as a direct result of a previous condition or action. In some examples, a first condition or action may be performed and second condition or action may occur directly as a result of the previous condition or action occurring independent of whether other conditions or actions occur. In some examples, a first condition or action may be performed and second condition or action may occur directly as a result of the previous condition or action occurring, such that no other intermediate conditions or actions occur between the earlier condition or action and the second condition or action or a limited quantity of one or more intermediate steps or actions occur between the earlier condition or action and the second condition or action. Any condition or action described herein as being performed "based on," "based at least in part on," or "in response to" some other step, action, event, or condition may additionally or alternatively (e.g., in an alternative example) be performed "in direct response to" or "directly in response to" such other condition or action unless otherwise specified.

The devices discussed herein, including a memory array, may be formed on a semiconductor substrate, such as silicon, germanium, silicon-germanium alloy, gallium arsenide, gallium nitride, etc. In some examples, the substrate is a semiconductor wafer. In some other examples, the substrate may be a silicon-on-insulator (SOI) substrate, such as silicon-on-glass (SOG) or silicon-on-sapphire (SOP), or epitaxial layers of semiconductor materials on another substrate. The conductivity of the substrate, or sub-regions of the substrate, may be controlled through doping using various chemical species including, but not limited to, phosphorous, boron, or arsenic. Doping may be performed during the initial formation or growth of the substrate, by ion-implantation, or by any other doping means.

A switching component or a transistor discussed herein may represent a field-effect transistor (FET) and comprise a three terminal device including a source, drain, and gate. The terminals may be connected to other electronic elements through conductive materials, e.g., metals. The source and drain may be conductive and may comprise a heavily-doped, e.g., degenerate, semiconductor region. The source and drain may be separated by a lightly-doped semiconductor region or channel. If the channel is n-type (i.e., majority carriers are electrons), then the FET may be referred to as an n-type FET. If the channel is p-type (i.e., majority carriers are holes), then the FET may be referred to as a p-type FET. The channel may be capped by an insulating gate oxide. The channel conductivity may be controlled by applying a voltage to the gate. For example, applying a positive voltage or negative voltage to an n-type FET or a p-type FET, respectively, may result in the channel becoming conductive. A transistor may be "on" or "activated" if a voltage greater than or equal to the transistor's threshold voltage is applied to the transistor gate. The transistor may be "off" or "deactivated" if a voltage less than the transistor's threshold voltage is applied to the transistor gate.

The description set forth herein, in connection with the appended drawings, describes example configurations and does not represent all the examples that may be implemented or that are within the scope of the claims. The term "exemplary" used herein means "serving as an example, instance, or illustration" and not "preferred" or "advantageous over other examples." The detailed description includes specific details to providing an understanding of the described techniques. These techniques, however, may be practiced without these specific details. In some instances, well-known structures and devices are shown in block diagram form to avoid obscuring the concepts of the described examples.

In the appended figures, similar components or features may have the same reference label. Further, various components of the same type may be distinguished by following the reference label by a hyphen and a second label that distinguishes among the similar components. If just the first reference label is used in the specification, the description is applicable to any one of the similar components having the same first reference label irrespective of the second reference label.

The functions described herein may be implemented in hardware, software executed by a processor, firmware, or any combination thereof. If implemented in software executed by a processor, the functions may be stored on or transmitted over, as one or more instructions or code, a computer-readable medium. Other examples and implementations are within the scope of the disclosure and appended claims. For example, due to the nature of software, functions described above can be implemented using software executed by a processor, hardware, firmware, hardwiring, or combinations of any of these. Features implementing functions may also be physically located at various positions, including being distributed such that portions of functions are implemented at different physical locations.

For example, the various illustrative blocks and components described in connection with the disclosure herein may be implemented or performed with a general-purpose processor, a DSP, an ASIC, an FPGA or other programmable logic device, discrete gate or transistor logic, discrete hardware components, or any combination thereof designed to perform the functions described herein. A general-purpose processor may be a microprocessor, but in the alternative, the processor may be any processor, controller, microcontroller, or state machine. A processor may be implemented as a combination of computing devices (e.g., a combination of a DSP and a microprocessor, multiple microprocessors, one or more microprocessors in conjunction with a DSP core, or any other such configuration).

As used herein, including in the claims, "or" as used in a list of items (for example, a list of items prefaced by a phrase such as "at least one of" or "one or more of") indicates an inclusive list such that, for example, a list of at least one of A, B, or C means A or B or C or AB or AC or BC or ABC (i.e., A and B and C). Also, as used herein, the phrase "based on" shall not be construed as a reference to a closed set of conditions. For example, an exemplary step that is described as "based on condition A" may be based on both a condition A and a condition B without departing from the scope of the present disclosure. In other words, as used herein, the phrase "based on" shall be construed in the same manner as the phrase "based at least in part on."

Computer-readable media includes both non-transitory computer storage media and communication media including any medium that facilitates transfer of a computer program from one place to another. A non-transitory storage medium may be any available medium that can be accessed by a general purpose or special purpose computer. By way of example, and not limitation, non-transitory computer-readable media can comprise RAM, ROM, electrically erasable programmable read-only memory (EEPROM), compact disk (CD) ROM or other optical disk storage, magnetic disk storage or other magnetic storage devices, or any other non-transitory medium that can be used to carry or store desired program code means in the form of instructions or data structures and that can be accessed by a general-purpose or special-purpose computer, or a general-purpose or special-purpose processor. Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, DSL, or wireless technologies such as infrared, radio, and microwave are included in the definition of medium. Disk and disc, as used herein, include CD, laser disc, optical disc, digital versatile disc (DVD), floppy disk, and Blu-ray disc, where disks usually reproduce data magnetically, while discs reproduce data optically with lasers. Combinations of the above are also included within the scope of computer-readable media.

The description herein is provided to enable a person skilled in the art to make or use the disclosure. Various modifications to the disclosure will be apparent to those skilled in the art, and the generic principles defined herein may be applied to other variations without departing from the scope of the disclosure. Thus, the disclosure is not limited to the examples and designs described herein but is to be accorded the broadest scope consistent with the principles and novel features disclosed herein.

What is claimed is:

1. A method, comprising:
    receiving, from a memory system, first information indicating a first temperature of the memory system for each write operation of a set of write operations and second information indicating a second temperature of the memory system for each read operation of a set of read operations and an indication of whether the read operation failed, the set of read operations corresponding to locations for the set of write operations;
    determining a set of temperature ranges used to indicate the first temperature and the second temperature of the memory system based at least in part on a difference between each first temperature for a write operation at a location and each second temperature for a read operation at the location and the indication of whether the read operation failed;
    determining a quantity of temperature bits to include in metadata associated with a second set of write operations and a second set of read operations, the quantity of temperature bits comprising one or more temperature bits indicating a temperature range of the set of temperature ranges and one or more parity bits associated with the one or more temperature bits; and
    transmitting, to the memory system, an indication of the set of temperature ranges and the quantity of temperature bits to include in the metadata.

2. The method of claim 1, further comprising:
    determining a difference between each first time for the write operation at the location and each second time for the read operation at the location, wherein the set of temperature ranges is determined based at least in part on the difference between each first time and each second time.

3. The method of claim 1, further comprising:
    categorizing the first information and the second information for different locations of the memory system into groups based on first differences between the first temperature for the write operation and the second temperature for the read operation and second differences between a first time for the write operation and a second time for the read operation;
    determining a set of candidate temperature ranges for each of the groups based at least in part on a respective quantity of indications that the read operation failed that is associated with each candidate temperature range of the set of candidate temperature ranges for each of the groups; and generating the set of temperature ranges from the set of candidate temperature ranges for each of the groups based at least in part on the respective quantity of indications that the read operation failed.

4. The method of claim 1, further comprising:
determining a set of candidate temperature thresholds to separate the set of temperature ranges; and
generating a set of temperature thresholds to separate the set of temperature ranges from the set of candidate temperature thresholds based at least in part on a respective quantity of indications that the read operation failed that is associated with each candidate temperature threshold of the set of candidate temperature thresholds.

5. The method of claim 1, further comprising:
determining a quantity of the one or more temperature bits indicating the temperature range to include in the metadata based at least in part on a quantity of temperature ranges included in the set of temperature ranges.

6. The method of claim 1, further comprising:
determining a quantity of the one or more parity bits associated with the one or more temperature bits to include in the metadata based at least in part on a total quantity of indications that the read operation failed.

7. The method of claim 1, wherein the metadata comprises the quantity of temperature bits and a quantity of parity bits associated with error correcting data written as part of write operations of the second set of write operations.

8. The method of claim 1, wherein a failure of the read operation corresponds an uncorrectable error in reading data stored at the location as part of the write operation.

9. The method of claim 1, wherein:
the first information comprises a first time for each write operation of the set of write operations, a size of data written as part of each write operation of the set of write operations, and a location to which the data is written for each write operation of the set of write operations, and
the second information comprises a second time for each read operation, a size of data read as part of each read operation, and a location from which the data is read for each read operation.

10. A method, comprising:
writing, by a memory system, data to a first set of memory cells of the memory system as part of a write operation;
determining a temperature of the memory system during the write operation; and
writing a quantity of temperature bits to metadata associated with the write operation based at least in part on the temperature of the memory system, the metadata stored at a second set of memory cells, the quantity of temperature bits comprising one or more temperature bits indicating a temperature range comprising the temperature and one or more parity bits associated with the one or more temperature bits.

11. The method of claim 10, further comprising:
determining a second temperature of the memory system during a read operation of the data written to the first set of memory cells;
reading the metadata to determine the temperature range indicated by the one or more temperature bits; and reading the data written to the first set of memory cells as part of the read operation based at least in part on the temperature range and the second temperature.

12. The method of claim 11, further comprising:
selecting a trim parameter for reading the data written to the first set of memory cells based at least in part on the temperature range comprising the temperature of the memory system during the write operation and the second temperature of the memory system during the read operation.

13. The method of claim 11, further comprising:
selecting a trim parameter for reading the data written to the first set of memory cells based at least in part on the temperature range being different from a second temperature range comprising the second temperature of the memory system during the read operation.

14. The method of claim 10, further comprising:
transmitting, to a server, first information indicating a first temperature of the memory system for each write operation of a set of write operations and second information indicating a second temperature of the memory system for each read operation of a set of read operations and an indication of whether the read operation failed, the set of read operations corresponding to locations for the set of write operations; and
receiving, from the server and based at least in part on transmitting the first information and the second information, an indication of a set of temperature ranges comprising the temperature and the quantity of temperature bits to include in the metadata, wherein writing the quantity of temperature bits to the metadata is based at least in part on receiving the indication.

15. The method of claim 14, wherein a quantity of the one or more parity bits associated with the one or more temperature bits to include in the metadata is based at least in part on a total quantity of indications that the read operation failed.

16. The method of claim 14, wherein a failure of the read operation corresponds an uncorrectable error in reading data stored at the locations as part of the write operation.

17. The method of claim 10, wherein the metadata comprises the quantity of temperature bits and a quantity of parity bits associated with error correcting data written as part of the write operation.

18. A method, comprising:
determining a temperature of a memory system during a set of write operations to locations of the memory system;
determining a score for a trim parameter associated with performing read operations to the locations, wherein the score is based at least in part on a probability that using the trim parameter to perform the read operations causes the read operations to fail when the memory system is at the temperature; and
transmitting, to the memory system, an indication of the trim parameter for performing the read operations based at least in part on a current temperature of the memory system and the score for the trim parameter.

19. The method of claim 18, further comprising:
determining a priority associated with respective data written to the locations during the set of write operations, wherein the score is based at least in part on the priority associated with the respective data.

20. The method of claim 18, further comprising:
determining a set of scores for a set of trim parameters associated with performing the read operations, the set of trim parameters comprising the trim parameter, wherein each score of the set of scores is based at least in part on a respective probability that using a respective trim parameter to perform the read operations causes the read operations to fail when the memory system is at the temperature; and determining a usage order of the set of trim parameters for performing the read operations based at least in part on the set of scores, wherein transmitting the indication of the trim parameter comprises:

transmitting an indication of the usage order of the set of trim parameters.

21. The method of claim 18, wherein the current temperature of the memory system corresponds to a temperature of the memory system at a boot time of the memory system.

22. The method of claim 18, wherein determining the temperature of the memory system during the set of write operations comprises:

reading metadata associated with the set of write operations, the metadata comprising a quantity of temperature bits that includes one or more temperature bits indicating a temperature range comprising the temperature of the memory system and one or more parity bits associated with the one or more temperature bits.

23. A method, comprising:

receiving, at a memory system from a server, an indication of a trim parameter for performing a read operation at the memory system based at least in part on a temperature of the memory system and a probability that using the trim parameter to perform the read operation causes the read operation to fail when the memory system is at the temperature; and performing, at the memory system, the read operation using the trim parameter based at least in part on receiving the indication.

24. The method of claim 23, wherein receiving the indication of the trim parameter comprises:

receiving an indication of a usage order of a set of trim parameters for performing the read operation, the set of trim parameters comprising the trim parameter, wherein the read operation is performed in accordance with the usage order.

25. The method of claim 23, wherein the trim parameter is indicated based at least in part on a priority of data read as part of the read operation.

26. The method of claim 23, further comprising:

transmitting, to the server, metadata associated with a write operation to a location of the memory system corresponding to the read operation, the metadata comprising a quantity of temperature bits that includes one or more temperature bits indicating a temperature range comprising a previous temperature of the memory system during the write operation and one or more parity bits associated with the one or more temperature bits, wherein receiving the indication of the trim parameter is based at least in part on the metadata.

27. The method of claim 23, wherein performing the read operation comprises:

reading data stored at a location indicated by the read operation using a first reference voltage associated with the trim parameter;

determining one or more errors associated with the data read using the first reference voltage; and read the data using a second reference voltage associated with a second trim parameter based at least in part on determining the one or more errors, the second trim parameter selected based at least in part on a second probability that using the second trim parameter to perform the read operation causes the read operation to fail when the memory system is at the temperature, wherein the second probability is greater than the probability.

28. A method, comprising:

determining that a temperature of a memory system is within a first range of temperatures;

determining a location of the memory system that stores data written at a time during which a previous temperature of the memory system failed to satisfy a threshold temperature, the threshold temperature outside of the first range of temperatures; and performing a refresh operation on the location while the temperature of the memory system is within the first range of temperatures based at least in part on the data being written while the previous temperature failed to satisfy the threshold temperature.

29. The method of claim 28, further comprising:

determining that a priority associated with the data satisfies a threshold priority, wherein the refresh operation is performed based at least in part on the priority satisfying the threshold priority.

30. The method of claim 28, further comprising:

determining the previous temperature of the memory system based at least in part on a quantity of temperature bits included in metadata associated with the data, the quantity of temperature bits comprising one or more temperature bits indicating a temperature range comprising the previous temperature of the memory system and one or more parity bits associated with the one or more temperature bits, wherein the temperature range is outside of a threshold temperature range.

31. The method of claim 28, wherein the previous temperature failing to satisfy the threshold temperature comprises the previous temperature being greater than the threshold temperature.

32. The method of claim 28, wherein the previous temperature failing to satisfy the threshold temperature comprises the previous temperature being less than the threshold temperature.

* * * * *